United States Patent
Fukuda

(10) Patent No.: US 9,438,786 B2
(45) Date of Patent: Sep. 6, 2016

(54) FOCUS ADJUSTMENT APPARATUS, FOCUS ADJUSTMENT METHOD AND PROGRAM, AND IMAGING APPARATUS

(71) Applicant: CANON KABUSHIKI KAISHA, Tokyo (JP)

(72) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/279,790

(22) Filed: May 16, 2014

(65) Prior Publication Data
US 2014/0340567 A1    Nov. 20, 2014

(30) Foreign Application Priority Data

May 20, 2013   (JP) ................................. 2013-106195

(51) Int. Cl.
| H04N 5/232 | (2006.01) |
| H04N 5/369 | (2011.01) |
| H04N 5/357 | (2011.01) |
| H04N 101/00 | (2006.01) |

(52) U.S. Cl.
CPC ........ H04N 5/23212 (2013.01); H04N 5/3696 (2013.01); H04N 5/3572 (2013.01); H04N 2101/00 (2013.01)

(58) Field of Classification Search
CPC ........... H04N 5/23212; H04N 5/3696; H04N 5/3572; H04N 2101/00
See application file for complete search history.

(56) References Cited

U.S. PATENT DOCUMENTS

| 4,410,804 A | 10/1983 | Stauffer |
| 6,829,008 B1 | 12/2004 | Kondo et al. |
| 8,988,595 B2 * | 3/2015 | Kunieda ............ H04N 5/23212 348/222.1 |
| 2003/0123867 A1 * | 7/2003 | Yoshida ................. G02B 7/285 396/104 |
| 2007/0206937 A1 * | 9/2007 | Kusaka .............. H04N 5/23212 396/89 |
| 2010/0194967 A1 * | 8/2010 | Amano .............. H04N 5/23212 348/345 |
| 2012/0300104 A1 * | 11/2012 | Onuki ................ H04N 5/23212 348/302 |
| 2013/0113987 A1 | 5/2013 | Fukuda |
| 2014/0146221 A1 | 5/2014 | Kimura et al. |
| 2014/0192220 A1 | 7/2014 | Kimura et al. |

FOREIGN PATENT DOCUMENTS

| EP | 1085751 A2 | 3/2001 |
| JP | 2000-156823 A | 6/2000 |
| JP | 2001-083407 A | 3/2001 |

OTHER PUBLICATIONS

U.S. Appl. No. 14/263,095, filed Apr. 28, 2014.

\* cited by examiner

*Primary Examiner* — Jason Flohre
(74) *Attorney, Agent, or Firm* — Fitzpatrick, Cella, Harper & Scinto

(57) ABSTRACT

A focus detection apparatus has an obtaining unit for obtaining a first image signal corresponding to object light passing through a first pupil area of a focusing optical system and a second image signal corresponding to object light passing through a pupil area different from the first pupil area of the focusing optical system, a combination unit for generating a combination signal by combining the first and second image signals at least one of which is shifted by a predetermined step, wherein the shift and the generation of the combination signal are performed for a plurality of predetermined steps and a plurality of combination signals are generated, a calculation unit for calculating a contrast evaluation value from the plurality of combination signals, and a focus detection unit for detecting a defocus amount on the basis of the contrast evaluation value and the shift amount of the shift.

27 Claims, 16 Drawing Sheets

PIXEL ADDRESS

PIXEL ADDRESS

PIXEL ADDRESS

PIXEL ADDRESS

FOCUS ADJUSTMENT APPARATUS, FOCUS ADJUSTMENT METHOD AND PROGRAM, AND IMAGING APPARATUS

BACKGROUND OF THE INVENTION

1. Field of the Invention

The present invention relates to a focus adjustment apparatus and a focus adjustment method and, more particularly, to a focus adjustment apparatus, a focus adjustment method, and an imaging apparatus for performing a focus adjustment by using pixel signals based on rays of object light which pass through different exit pupils of a focusing optical system.

2. Description of the Related Art

As one of focus adjustment methods of an imaging apparatus, there is an imaging plane phase difference method of performing a focus detection of a phase difference method by focus detection pixels formed on an imaging element. In a focus adjustment of the imaging plane phase difference method, a defocus direction and a defocus amount can be simultaneously detected by the focus detection pixels formed on the imaging element and the focus adjustment can be performed at a high speed.

For example, U.S. Pat. No. 4,410,804 discloses an imaging apparatus using a two-dimensional imaging element in which one microlens and a plurality of divided photoelectric conversion units are formed with respect to one pixel. The divided photoelectric conversion units are constructed so as to receive rays of light which pass through different areas of an exit pupil of a photographing lens through one microlens, and attain a pupil division. An image shift amount is obtained from focus detection signals received by the divided photoelectric conversion units (focus detection pixels) and a focus detection of a phase difference method can be performed. Japanese Patent Application Laid-Open No. 2001-083407 discloses such a technique that an image pickup signal is generated by adding focus detection signals received by the divided photoelectric conversion units.

Japanese Patent Application Laid-Open No. 2000-156823 discloses such an imaging apparatus that a pair of focus detection pixels are partially arranged on an imaging plane of a two-dimensional imaging element constructed by a plurality of image pickup pixels. In such an imaging apparatus, the pupil division is attained by constructing one pair of focus detection pixels in such a manner that rays of object light which pass through different areas of an exit pupil of a photographing lens is received by a light shielding layer having an aperture portion. There has also been disclosed such a technique that image pickup signals are obtained by the image pickup pixels arranged in most of the imaging plane of the two-dimensional imaging element, an image shift amount is obtained from pixel signals of the focus detection pixels which are partially arranged and the focus detection of the phase difference method is performed.

However, according to the imaging plane phase difference method, since the rays of light which are received by the focus detection pixels which perform the focus detection and the rays of light which are received by the image pickup pixels which obtain the picked-up image differ, an influence on the focus detection signal by each aberration (spherical aberration, astigmatism, coma, or the like) of the photographing lens and that on the image pickup signal differ. Therefore, there is such a problem that a difference occurs between a detected in-focus position which is calculated from the focus detection signal and a most-preferable in-focus position of the image pickup signal.

The invention is made in consideration of the foregoing problem and it is an object of the invention to suppress a difference between a detected in-focus position which is calculated from a focus detection signal and a most-preferable in-focus position of an image pickup signal and to enable a focus detection to be performed at a high accuracy.

SUMMARY OF THE INVENTION

According to the invention, there is provided a focus detection apparatus comprising: an obtaining unit configured to obtain a first image signal corresponding to object light which passes through a first pupil area of a focusing optical system and a second image signal corresponding to object light which passes through a pupil area different from the first pupil area of the focusing optical system; a combination unit configured to generate a combination signal obtained by combining the first and second image signals at least one of which is shifted by a predetermined step, wherein the shift and the generation of the combination signal which are performed by the combination unit are executed for a plurality of predetermined steps and a plurality of combination signals are generated; a calculation unit configured to calculate a contrast evaluation value from the plurality of combination signals; and a focus detection unit configured to detect a defocus amount on the basis of the contrast evaluation value and a shift amount of the shift.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the present invention will be described in detail below with reference to the drawings.

First Embodiment

Whole Construction

Figure 1:
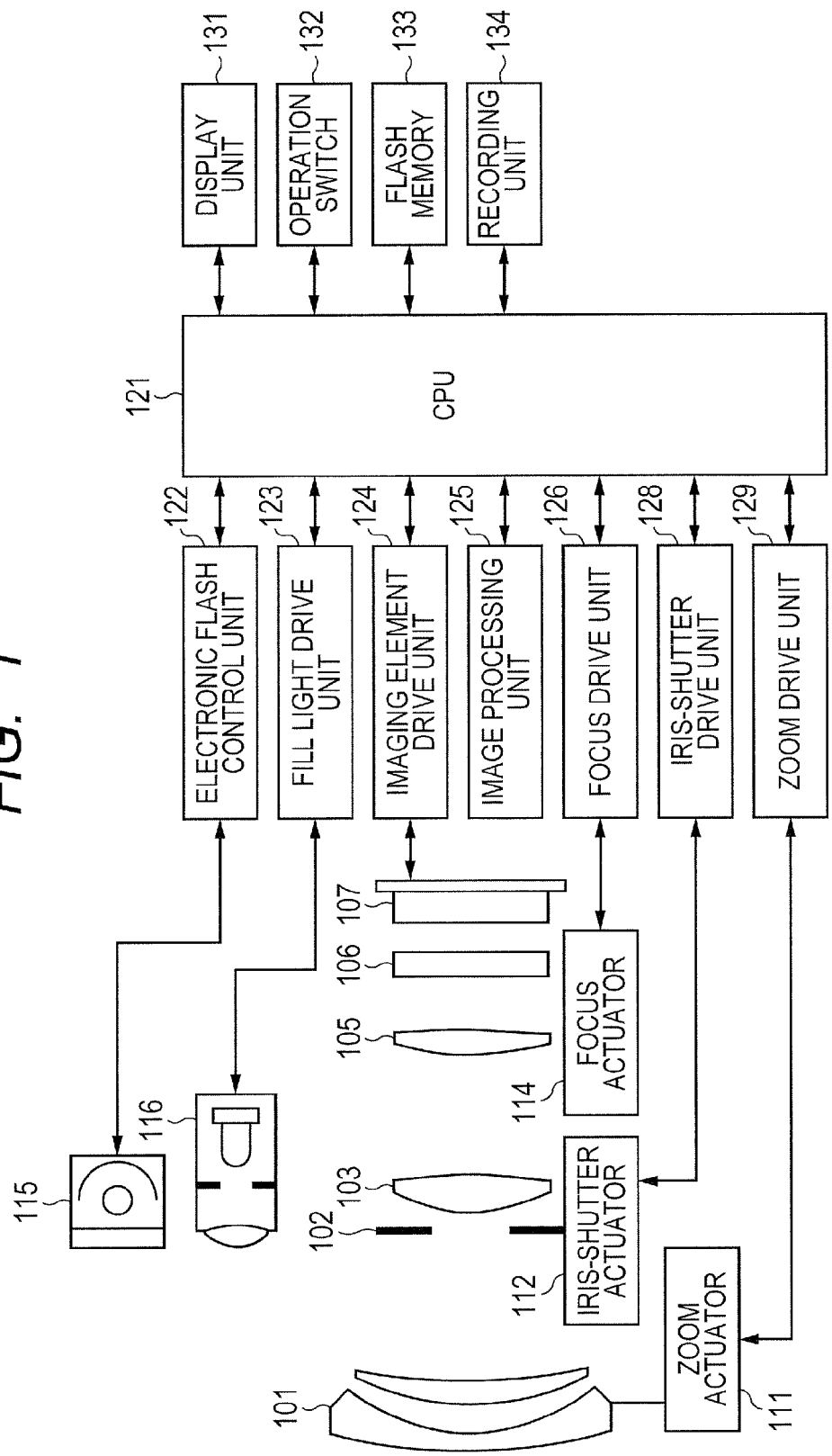
FIG. 1 is a schematic constructional diagram of an imaging apparatus to which a focus adjustment apparatus according to the first embodiment of the invention is applied.

FIG. 1 is a diagram illustrating a construction of a camera serving as an imaging apparatus to which a focus adjustment apparatus according to the first embodiment of the invention is applied. As will be described hereinbelow, the imaging apparatus is an apparatus which has an imaging element having a microlens serving as a pupil division unit of an exit pupil of a focusing optical system and can perform a focus adjustment of an imaging plane phase difference method.

In the diagram, a first lens group 101 is arranged at a front end of the focusing optical system for forming an optical image of an object and is held movably backward and forward in an optical axis direction. An iris shutter 102 adjusts a light amount upon photographing by adjusting an aperture diameter and also has a function as an exposure time adjusting shutter at the time of still image photographing. A second lens group 103 is provided. The iris shutter 102 and the second lens group 103 integratedly move backward and forward in the optical axis direction and realize a magnification effect (zoom function) by an interlocking relational manner with the backward and forward moving operation of the first lens group 101.

A third lens group 105 performs a focus adjustment by the backward and forward motion in the optical axis direction. An optical low-pass filter 106 is an optical element for reducing false color and moire of a photographed image. An imaging element 107 is constructed by a two-dimensional CMOS photosensor and its peripheral units and is arranged on an imaging plane of the focusing optical system.

In order to realize the magnification effect, a zoom actuator 111 drives the first lens group 101 and the second lens group 103 movably backward and forward in the optical axis direction by rotating a cam barrel (not shown), thereby performing a magnification operation. An iris-shutter actuator 112 controls an aperture diameter of the iris shutter 102 for adjusting a photographing light amount and controls an exposure time at the time of still image photographing. A focus actuator 114 drives the third lens group 105 movably backward and forward in the optical axis direction in order to perform the focus adjustment.

An electronic flash 115 for illuminating an object upon photographing is provided. Although it is desirable to use a flash illumination device using a xenon tube as a flash 115, another illumination device having an LED which continuously emits light may be used. An AF fill light unit 116 projects an image of a mask having a predetermined aperture pattern onto a field through a light projection lens and improves a focus detection ability to a dark object or a low contrast object.

A CPU 121 is a CPU built in a camera for making various kinds of control of a camera main body and has an arithmetic operation unit, a ROM, a RAM, an A/D converter, a D/A converter, a communication interface unit, and the like. The CPU 121 loads and executes a predetermined program stored in the ROM, thereby driving each unit held in the camera and executing a series of operations such as AF, photographing, image processing, recording, and the like. The CPU 121 is a unit constructing the focus adjustment apparatus of the invention together with an image processing unit 125, which will be described hereinafter, and controls a signal processing for focus adjustment and the driving of the focusing optical system.

An electronic flash control unit 122 controls an on and off state of the illumination unit 115 synchronously with the photographing operation. A fill light drive unit 123 controls on and off of the AF fill light unit 116 synchronously with the focus detecting operation. An imaging element drive unit 124 controls the image pickup operation of the imaging element 107, converts an obtained analog image signal into a digital signal, and transmits to the CPU 121. The image processing unit 125 executes processings such as γ conversion, color interpolation, JPEG compression, and the like of the image signal generated by the imaging element 107.

A focus drive unit 126 drives the focus actuator 114 on the basis of a result of the focus detection and drives the third lens group (focus lens) 105 movably backward and forward in the optical axis direction in order to perform the focus adjustment. An iris-shutter drive unit 128 drives the iris-shutter actuator 112, thereby controlling an aperture of the iris shutter 102. A zoom drive unit 129 drives the zoom actuator 111 in accordance with the zoom operation of the photographer.

A display unit 131 such as an LCD or the like displays information regarding a photographing mode of the camera, a preview image before photographing, a post-photographing confirmation image, an in-focus state displaying image at the time of the focus detection, and the like. An operation switch group 132 is constructed by a power switch, a release (photographing trigger) switch, a zoom operation switch, a photographing mode selection switch, and the like. A photographed image is recorded into a detachable flash memory 133 in a predetermined recording format by a recording unit 134.

Imaging Element

Figure 2:
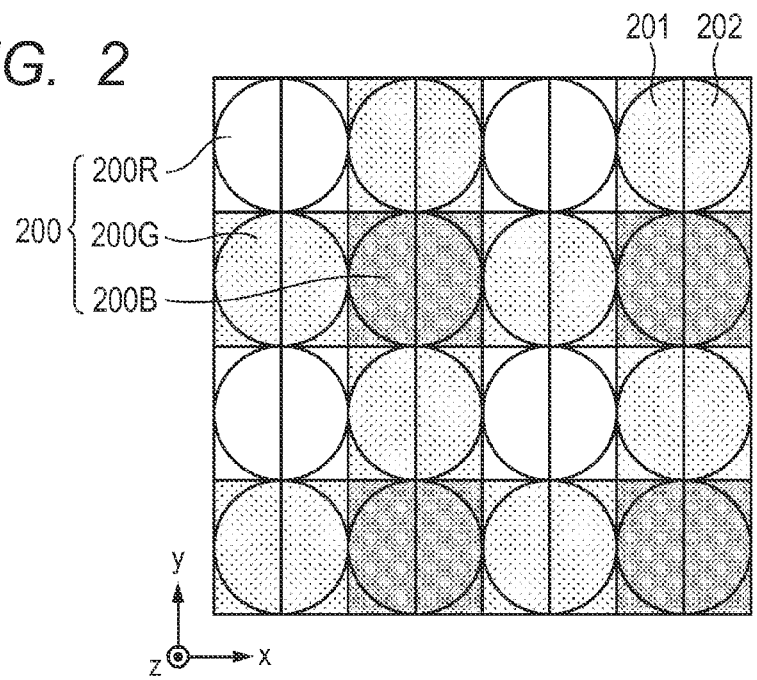
FIG. 2 is a schematic diagram of a pixel array of an imaging element which is used in the imaging apparatus in the first embodiment of the invention.

FIG. 2 illustrates a schematic diagram of a pixel array of the imaging element held in the imaging apparatus of the first embodiment. In the diagram, a pixel array of a two-dimensional CMOS sensor serving as an imaging element which is used in the first embodiment is illustrated in a range of (4 columns×4 rows) of image pickup pixels (as an array of the focus detection pixels, a range of 8 columns×4 rows).

In the present embodiment, a pixel group 200 of (2 columns×2 rows) illustrated in FIG. 2 is constructed in such a manner that a pixel 200R having a spectrum sensitivity of R (red) is arranged at an upper left position in the diagram, pixels 200G having a spectrum sensitivity of G (green) are arranged at an upper right position and a lower left position, and a pixel 200B having a spectrum sensitivity of B (blue) is arranged at a lower right position, respectively. Further, each pixel is constructed by a first focus detection pixel 201 and a second focus detection pixel 202 arranged in an array of (2 columns×1 row).

In the imaging element 107, a number of image pickup pixels of (4 columns×4 rows) (focus detection pixels of 8 columns×4 rows) illustrated in FIG. 2 are arranged on the imaging plane, thereby enabling the image pickup signal and the focus detection signals to be obtained. The present embodiment will be described on the assumption that the imaging element 107 is an element constructed in such a manner that a pitch P of the pixels is equal to 4 μm, the number N of pixels is equal to about 20.75 million pixels (5575 columns in the lateral direction×3725 rows in the vertical direction), a column-direction pitch $P_{AF}$ of the focus detection pixels is equal to 2 μm, and the number $N_{AF}$ of focus detection pixels is equal to about 41.50 million pixels (11150 columns in the lateral direction×3725 rows in the vertical direction), respectively.

Figure 3A:
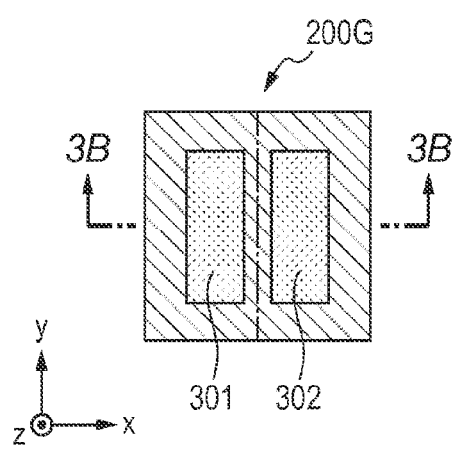
FIGS. 3A and 3B are a schematic plan view and a schematic cross sectional view of a pixel construction of the imaging element which is used in the imaging apparatus in the first embodiment of the invention.
Figure 3B:
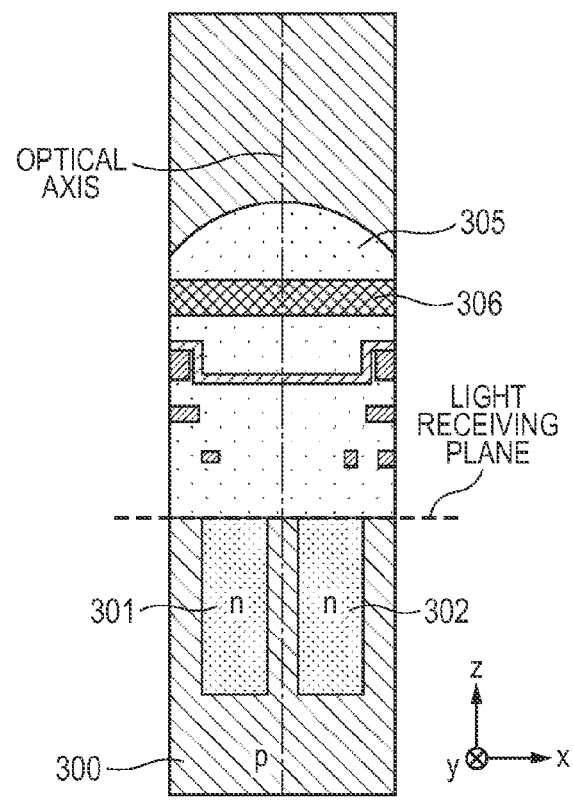

FIG. 3A illustrates a plan view when viewing one pixel 200G of the imaging element illustrated in FIG. 2 from the light receiving plane side (+z side) of the imaging element. FIG. 3B illustrates a cross sectional view when viewing a cross section taken along the line a-a in FIG. 3A from the −y side.

As illustrated in FIGS. 3A and 3B, in the pixel 200G of the embodiment, a microlens 305 to converge incident light onto the light receiving plane of each pixel is formed. A photoelectric conversion unit 301 and a photoelectric conversion unit 302 which are divided into $N_H$ portions (two portions) in the x direction and $N_V$ portions (one portion) in the y direction are formed. The photoelectric conversion unit 301 and the photoelectric conversion unit 302 correspond to the first focus detection pixel 201 and the second focus detection pixel 202, respectively.

Each of the photoelectric conversion units 301 and 302 may be a pin-structure photodiode in which an intrinsic layer is sandwiched between a p-type layer and an n-type layer or may be a pn-junction photodiode in which an intrinsic layer is omitted in accordance with necessity.

In each pixel, a color filter 306 is formed between the microlens 305 and the photoelectric conversion units 301 and 302. A spectrum transmissivity of the color filter may be changed every sub pixel or the color filter may be omitted in accordance with necessity.

The light which entered the pixel 200G illustrated in FIGS. 3A and 3B is converged by the microlens 305, is separated by the color filter 306, and thereafter, is received by the photoelectric conversion units 301 and 302. In each of the photoelectric conversion units 301 and 302, an electron and a hole are generated through pair production in accordance with the light reception amount by the photoelectric conversion and are separated by a depletion layer. After that, the electron of a negative charge is accumulated in the n-type layer (not shown). The hole is discharged to the outside of the imaging element through the p-type layer connected to a constant voltage source (not shown). The electrons accumulated in the n-type layer (not shown) of each of the photoelectric conversion units 301 and 302 are transferred to an electric capacitor portion (FD) (not shown) through a transfer gate, are converted into a voltage signal, and are output as a pixel signal.

Figure 4:
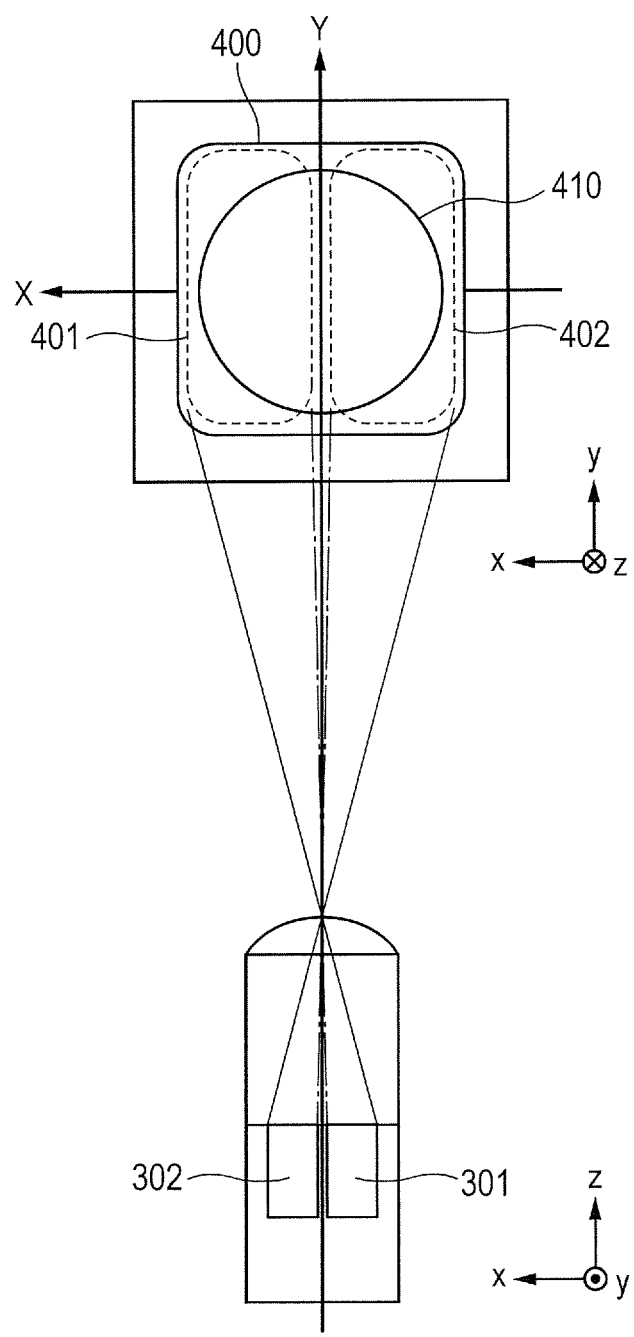
FIG. 4 is a diagram for describing a correspondence between a pixel and pupil division areas of the imaging element which is used in the imaging apparatus in the first embodiment of the invention.

FIG. 4 illustrates a correspondence relation between the pixel structure and the pupil division in the present embodiment illustrated in FIGS. 3A and 3B. FIG. 4 illustrates a cross sectional view when viewing a cross section taken along the line a-a of the pixel structure in the first embodiment illustrated in FIG. 3A from the +y side and also illustrates an exit pupil plane of the focusing optical system. In FIG. 4, in order to obtain a correspondence with a coordinate axis of the exit pupil plane, an x axis and a y axis of the cross sectional view are inverted from those in FIGS. 3A and 3B. In FIG. 4, portions similar to those in FIGS. 3A and 3B are designated by the same reference numerals.

As illustrated in FIG. 4, by the microlens, there is an almost conjugate relation between a first pupil partial area 401 of the first focus detection pixel 201 and the light receiving plane of the photoelectric conversion unit 301 whose center of gravity is deviated in the −x direction. The area 401 shows a pupil area, light passing through which can be received by the first focus detection pixel 201. The center of gravity of the first pupil partial area 401 of the first focus detection pixel 201 is deviated to the +X side on the pupil plane. In FIG. 4, by the microlens, there is an almost conjugate relation between a second pupil partial area 402 of the second focus detection pixel 202 and the light receiving plane of the photoelectric conversion unit 302 whose center of gravity is deviated in the +x direction. The area 402 shows a pupil area, light passing through which can be received by the second focus detection pixel 202. The center of gravity of the second pupil partial area 402 of the second focus detection pixel 202 is deviated to the −X side on the pupil plane. In FIG. 4, a pupil area 400 is a pupil area where the light can be received by the whole pixel 200G in the case where the photoelectric conversion unit 301 and the photoelectric conversion unit 302 (the first focus detection pixel 201 and the second focus detection pixel 202) are added.

Figure 5:
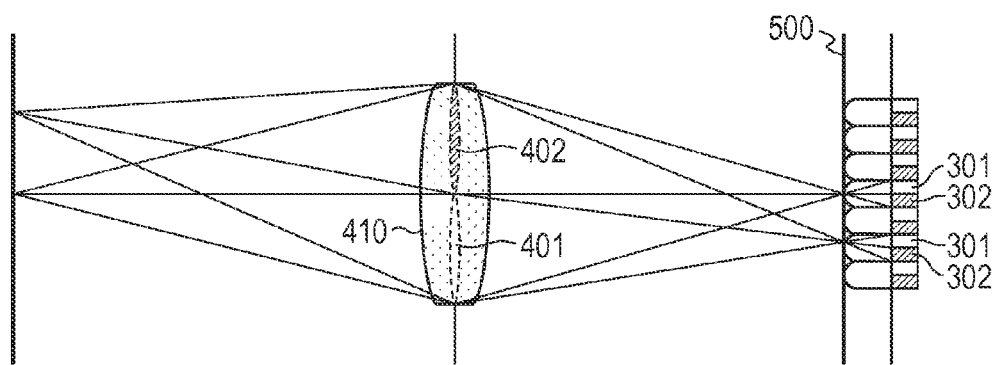
FIG. 5 is a diagram for describing a pupil division in a focusing optical system and the imaging element which are used in the imaging apparatus in the first embodiment of the invention.

FIG. 5 illustrates a schematic diagram of a correspondence relation between the imaging element of the embodiment and the pupil division which is made by the microlens (pupil division unit). The rays of light which pass through the different pupil partial areas of the first pupil partial area 401 and the second pupil partial area 402 of an exit pupil 410 enter each pixel of the imaging element at different angles, respectively, and are received by the first focus detection pixel 201 and the second focus detection pixel 202 which are divided into (2×1) areas. Although an example in which the pupil area is pupil-divided into two areas in the horizontal direction is shown in the present embodiment, the pupil area may be pupil-divided in the vertical direction in accordance with necessity.

As mentioned above, the imaging element which is used in the present embodiment has: the first focus detection pixel which receives the ray of light passing through the first pupil partial area of the focusing optical system; and the second focus detection pixel which receives the ray of light passing through the second pupil partial area of the focusing optical system different from the first pupil partial area. The imaging element also has an array of image pickup pixels which receive a ray of light which passes through a pupil area in which the first pupil partial area and the second pupil partial area of the focusing optical system are added. In the imaging element of the present embodiment, each image pickup pixel is constructed by the first focus detection pixel and the second focus detection pixel. However, the image pickup pixel may be constructed separately from that of the first and second focus detection pixels and the first and second focus detection pixels may be partially arranged in a part of the image pickup pixel array in accordance with necessity.

In the present embodiment, the first focus detection signal is generated by collecting the light reception signals of the first focus detection pixel 201 of each pixel of the imaging element, the second focus detection signal is generated by collecting the light reception signals of the second focus detection pixel 202 of each pixel, and the focus detection is performed. The image pickup signal (picked-up image) of a resolution of the number N of effective pixels is generated by adding the signals of the first focus detection pixel 201 and the second focus detection pixel 202 every pixel of the imaging element.

Relation Between Defocus Amount and Image Shift Amount

Subsequently, a relation between an image shift amount and a defocus amount of the first focus detection signal and the second focus detection signal which are obtained by the imaging element which is used in the present embodiment will be described.

Figure 6:
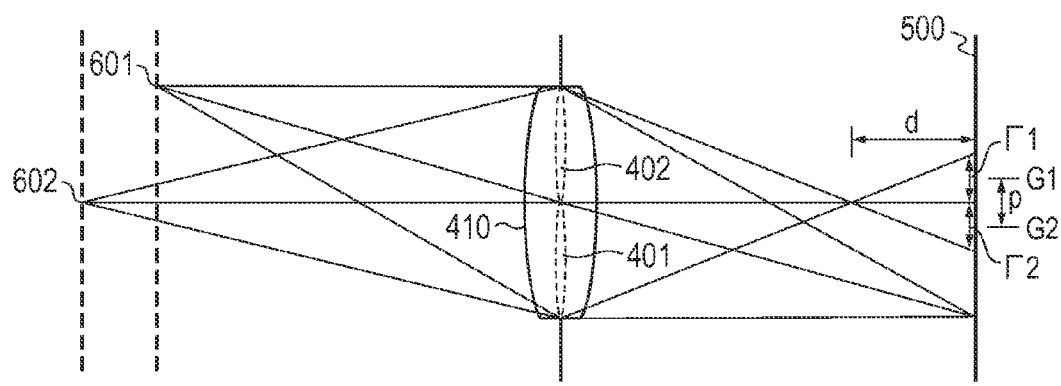
FIG. 6 is a diagram illustrating a relation between a defocus amount and an image shift amount of an image based on a first focus detection signal and a second focus detection signal which are obtained from pixel signals from the imaging element which is used in the imaging apparatus in the first embodiment of the invention.

FIG. 6 illustrates a relation between the defocus amount of the first and second focus detection signals and the image shift amount between the first and second focus detection signals. The imaging element (not shown) in the present embodiment is arranged on an imaging plane 500. In a manner similar to FIGS. 4 and 5, the exit pupil of the focusing optical system is divided into two areas of the first pupil partial area 401 and the second pupil partial area 402. In FIG. 6, portions similar to those in FIGS. 3A to 5 are designated by the same reference numerals.

A defocus amount d is defined as follows. When a magnitude of a distance from a focusing position of the object to the imaging plane 500 is assumed to be |d|, a state in which a focal plane of the object is on the object side of the imaging plane 500 is set to be negative (d<0) and a state in which the focal plane of the object is on the opposite side of the imaging plane 500 to the object is set to be positive (d>0). An in-focus state in which the focal plane of the object is on the imaging plane 500 (in-focus position) is set to (d=0). In FIG. 6, an example in which an object 601 is in the in-focus state (d=0) is shown and an example in which an object 602 is in the state (d<0) in which the focal plane of the object is on the object side of the imaging plane is shown. The state (d<0) in which the focal plane of the object is on the object side of the imaging plane and the state (d>0) in which the focal plane of the object is on the opposite side of the imaging plane 500 to the object are collectively referred to as a defocus state (|d|>0).

In the state (d<0) in which the focal plane of the object is on the object side of the imaging plane, the object light which passed through the first pupil partial area 401 in the ray of light from the object 602 is converged once and thereafter spreads to an extent of a width $\Gamma 1$ at a center G1 of gravity of the ray of light, so that the object light forms a blurred image on the imaging plane 500. This is true of the object light which passes through the second pupil partial area 402 and the object light forms a blurred image which spreads to an extent of a width $\Gamma 2$ at a center G2 of gravity of the ray of light. The light of the blurred image is received by the first focus detection pixel 201 (second focus detection pixel 202) constructing each pixel arranged in the imaging element, so that the first focus detection signal (second focus detection signal) is generated. Therefore, the first focus detection signal (second focus detection signal) is recorded as such an object image that the object 602 is blurred to an extent of the width $\Gamma 1$ ($\Gamma 2$) at the center G1 (G2) of gravity on the imaging plane 500. In association with an increase in magnitude |d| of the defocus amount d, the blurring width $\Gamma 1$ ($\Gamma 2$) of the object image increases almost in proportion to it. Similarly, in association with an increase in magnitude |d| of the defocus amount d, a magnitude |p| of an image shift amount p of the object image between the first and second focus detection signals (=difference (G1−G2) between the positions of the centers of gravity of the rays of light) also increases almost in proportion to it. This is true of the state (d>0) in which the focal plane of the object is on the opposite side of the imaging plane 500 to the object although the image shift direction of the object image between the first and second focus detection signals is opposite to that in the state in which the focal plane of the object is on the object side of the imaging plane.

Therefore, in association with the increase in magnitude of the defocus amount of the first and second focus detection signals or in association with an increase in magnitude of a defocus amount of an image pickup signal in which the first and second focus detection signals are added, a magnitude of the image shift amount between the first and second focus detection signals increases.

Focus Detection

In the present embodiment, the first focus detection of the phase difference method and the second focus detection of the method based on the refocus principle (hereinbelow, called a refocus method) are performed by using the relation between the defocus amount and the image shift amount of the first and second focus detection signals mentioned above. The first focus detection is performed until a focus adjustment state of the object is in a range from the large defocus state to the small defocus state and the second focus detection is performed until the focus adjustment state of the object is in a range from the small defocus state to a neighborhood of the most-preferable in-focus position. In the present embodiment, a determination about the focus adjustment state of the object is made by comparing a predetermined value with the detected defocus amount.

First Focus Detection of Phase Difference Method

First, the first focus detection of the phase difference method in the present embodiment will be described.

In the focus detection of the phase difference method, the first and second focus detection signals are relatively shifted, a correlation amount showing a degree of agreement between the signals (first evaluation value) is calculated, and the image shift amount is detected from such a shift amount that the correlation (degree of agreement between the signals) is improved. From such a relation that in association with an increase in magnitude of the defocus amount of the image pickup signals, the magnitude of the image shift amount between the first and second focus detection signals increases, the image shift amount is converted into the first detecting defocus amount and the focus detection is performed.

Figure 7:
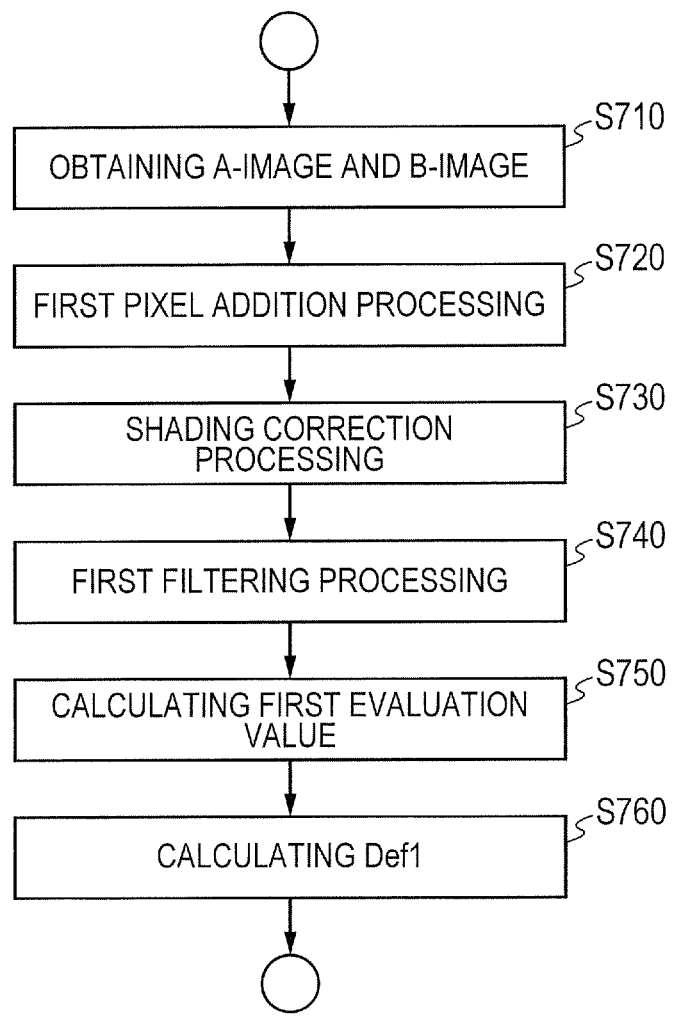
FIG. 7 is a diagram illustrating a flowchart for the operation of the first focus detection in the first embodiment of the invention.

FIG. 7 illustrates a flowchart for the operation of the first focus detection of the first embodiment. The operation in FIG. 7 is executed by the imaging element 107, the image processing unit 125, and the CPU 121 for controlling them.

In step S710, first, the CPU 121 sets a focus detection area to perform the focus adjustment from the effective pixel areas of the imaging element. Subsequently, the CPU 121 controls the imaging element 107, obtains the first focus detection signal from the light receiving signal of the first focus detection pixel of the focus detection area and obtains the second focus detection signal from the light receiving signal of the second focus detection pixel of the focus detection area.

In step S720, the image processing unit 125 executes a 3-pixel addition processing in the column direction to each of the first and second focus detection signals in order to suppress the signal data amount and, further, executes a Bayer (RGB) addition processing in order to convert an RGB signal into a luminance signal Y. Those two addition processings are collectively referred to as a first pixel addition processing.

In step S730, the image processing unit 125 further executes a shading correction processing (optical correction processing) to each of the first and second focus detection signals. In the focus detection of the phase difference method, the first detecting defocus amount is detected on the basis of the correlation between the first and second focus detection signals (degree of agreement between the signals). If a shading due to the pupil deviation occurs, there is a case where the correlation between the first and second focus detection signals (degree of agreement between the signals) decreases. Therefore, in the first focus detection of the phase difference method, it is desirable to execute the shading correction processing (optical correction processing) in order to improve the correlation between the first and second focus detection signals (degree of agreement between the signals) and improve the focus detection performance.

The shading due to the pupil deviation of the first and second focus detection signals will now be described.

Figure 8:
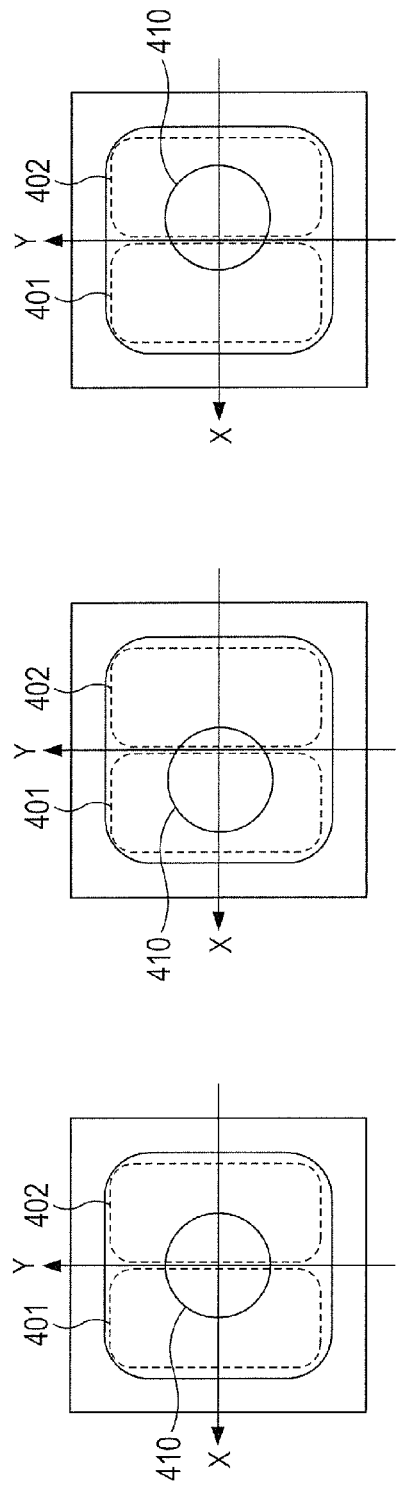
FIGS. 8A, 8B, and 8C are diagrams for describing a shading caused due to a pupil deviation of the first focus detection signal and the second focus detection signal in the first embodiment of the invention.

FIGS. 8A to 8C illustrate relations among the first pupil partial area 401 of the first focus detection pixel 201 in the peripheral image height of the imaging element, the second pupil partial area 402 of the second focus detection pixel 202, and the exit pupil 410 of the focusing optical system. Substantially the same portions as those in FIG. 4 are denoted with the same reference numerals.

FIG. 8A illustrates a case where an exit pupil distance D1 of the focusing optical system and a set pupil distance Ds of the imaging element are equal. In this case, the exit pupil 410 of the focusing optical system is almost uniformly pupil-divided by the first pupil partial area 401 and the second pupil partial area 402.

On the other hand, when the exit pupil distance D1 of the focusing optical system illustrated in FIG. 8B is shorter than the set pupil distance Ds of the imaging element, in the peripheral image height of the imaging element, a pupil deviation between the exit pupil of the focusing optical system and the incident pupil of the imaging element occurs, so that the exit pupil 410 of the focusing optical system is unevenly pupil-divided. Similarly, also when the exit pupil distance D1 of the focusing optical system illustrated in FIG. 8C is longer than the set pupil distance Ds of the imaging element, in the peripheral image height of the imaging element, a pupil deviation between the exit pupil of the focusing optical system and the incident pupil of the imaging element occurs, so that the exit pupil 410 of the focusing optical system is unevenly pupil-divided. In association with the pupil division becoming uneven in the peripheral image height, intensities of the first and second focus detection signals also become uneven a shading occurs where the intensity of one of the first and second focus detection signals increases and the intensity of the other focus detection signal decreases.

In step S730 in FIG. 7, the image processing unit 125 executes a shading correction processing (optical correction processing). First, a first shading correction coefficient of the first focus detection signal and a second shading correction coefficient of the second focus detection signal are generated in accordance with the image height of the focus detection area, an F value of the photographing lens (focusing optical system), and the exit pupil distance. Subsequently, the first focus detection signal is multiplied by the first shading correction coefficient, the second focus detection signal is multiplied by the second shading correction coefficient, and the shading correction processing (optical correction processing) of the first and second focus detection signals is finished.

In step S740 in FIG. 7, a first filtering processing is executed to the first and second focus detection signals. An example of a passband of the first filtering processing of the present embodiment is illustrated by a solid line in FIG. 9. In the embodiment, in order to perform the focus detection in a large defocus state by the first focus detection of the phase difference method, the passband of the first filtering processing is constructed so as to contain a low frequency band. When a focus adjustment is performed in a range from the large defocus state to a small defocus state in accordance with necessity, the passband of the first filtering processing at the time of the first focus detection may be adjusted to a higher frequency band in accordance with the defocus state as illustrated by an alternate long and short dash line in FIG. 9.

Subsequently, in step S750 in FIG. 7, a first shift processing for relatively shifting, in the pupil dividing direction, the first and second focus detection signals obtained after the first filtering processing is executed and a correlation amount (first evaluation value) showing a degree of agreement between the signals is calculated.

It is assumed that a kth first focus detection signal obtained after the first filtering processing is equal to A(k), a kth second focus detection signal is equal to B(k), and a range of a number k corresponding to the focus detection area is equal to W. Now, assuming that a shift amount by the first shift processing is equal to s1 and a shift range of the shift amount s1 is equal to Γ1, a correlation amount (first evaluation value) COR is calculated by the following equation (1).

$$COR(s_1) = \sum_{k \in W} |A(k) - B(k - s_1)|, \ s_1 \in \Gamma 1 \qquad (1)$$

By the first shift processing of the shift amount s1, a (k−s1)th second focus detection signal B(k−s1) is made correspond to the kth first focus detection signal A(k) to be subtracted from the kth first focus detection signal A(k), thereby generating a shift subtraction signal. An absolute value of the generated shift subtraction signal is calculated, a sum of the number k is obtained in the range W corresponding to the focus detection area, and a correlation amount (first evaluation value) COR(s1) is calculated. A correlation amount (first evaluation value) calculated every row may be added with respect to a plurality of rows for every shift amount in accordance with necessity.

In step S760, a shift amount of a real number value which minimizes the correlation amount is calculated from the correlation amount (first evaluation value) by a sub pixel operation and is set to an image shift amount p1. A first detecting defocus amount (Deft) is detected by multiplying the image shift amount p1 by a first conversion coefficient K1 according to the image height of the focus detection area, the F value of the photographing lens (focusing optical system), and the exit pupil distance.

As mentioned above, in the present embodiment, by the first focus detection unit of the phase difference method, the first filtering processing and the first shift processing are executed to the first and second focus detection signals, the correlation amount is calculated, and the first detecting defocus amount is detected from the correlation amount.

In the imaging element of the present embodiment, the ray of light which is received by the focus detection pixel (first focus detection pixel, second focus detection pixel) and the ray of light which is received by the image pickup pixel differ. Therefore, an influence on the focus detection pixel by each aberration (spherical aberration, astigmatism, coma, or the like) of the focusing optical system and that the image pickup signal differ. If an iris value of the focusing optical system is small (bright), a difference between them further increases. Therefore, when the iris value of the focusing optical system is small (bright), there is a case where a difference occurs between a detecting in-focus position which is calculated by the first focus detection of the phase difference method and the most-preferable in-focus position of the image pickup signal. Particularly, when the iris value of the focusing optical system is equal to or smaller than a predetermined iris value, there is a case where a focus detection accuracy of the first focus detection of the phase difference method deteriorates. The detecting in-focus position is a position where the first detecting defocus amount is equal to 0. The most-preferable in-focus position of the image pickup signal is an MTF (Modulation Transfer Function) peak position of the image pickup signal.

Figure 10:
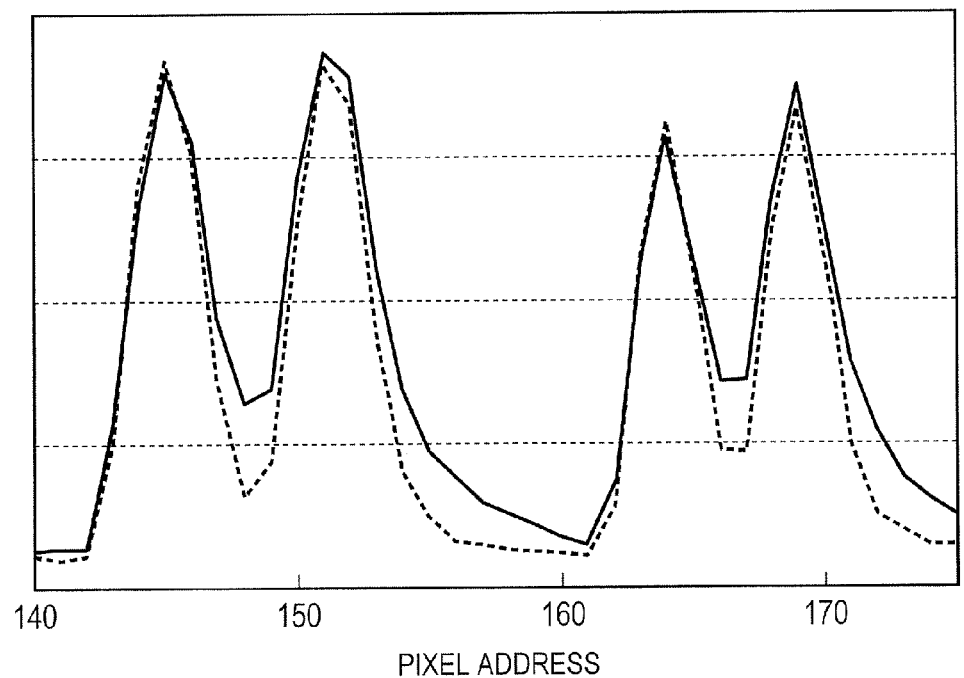
FIG. 10 is a diagram illustrating an example of the first focus detection signal and the second focus detection signal in the first embodiment of the invention.
Figure 11:
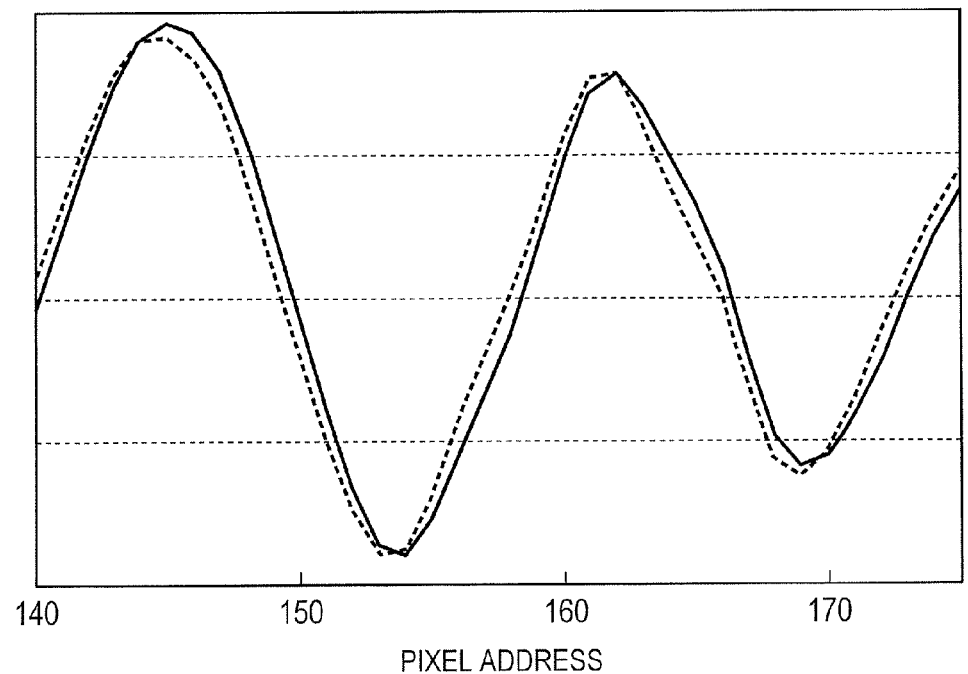
FIG. 11 is a diagram illustrating an example of the first focus detection signal and the second focus detection signal obtained after an optical correction processing and a first filtering processing in the first embodiment of the invention.

FIG. 10 illustrates an example of the first focus detection signal (broken line) and the second focus detection signal (solid line) at the most-preferable in-focus position of the image pickup signal in the peripheral image height of the imaging element of the present embodiment. As for the most-preferable in-focus position of the image pickup signal, FIG. 10 illustrates an example in which signal shapes of the first and second focus detection signals differ due to an influence of each aberration of the focusing optical system. FIG. 11 illustrates the first focus detection signal (broken line) and the second focus detection signal (solid line) obtained after the shading correction processing and the first filtering processing. As for the most-preferable in-focus position of the image pickup signal, the image shift amount p1 between the first and second focus detection signals is not equal to 0. Therefore, a difference occurs between the detecting in-focus position which is calculated by the first focus detection of the phase difference method and the most-preferable in-focus position of the image pickup signal.

Figure 12:
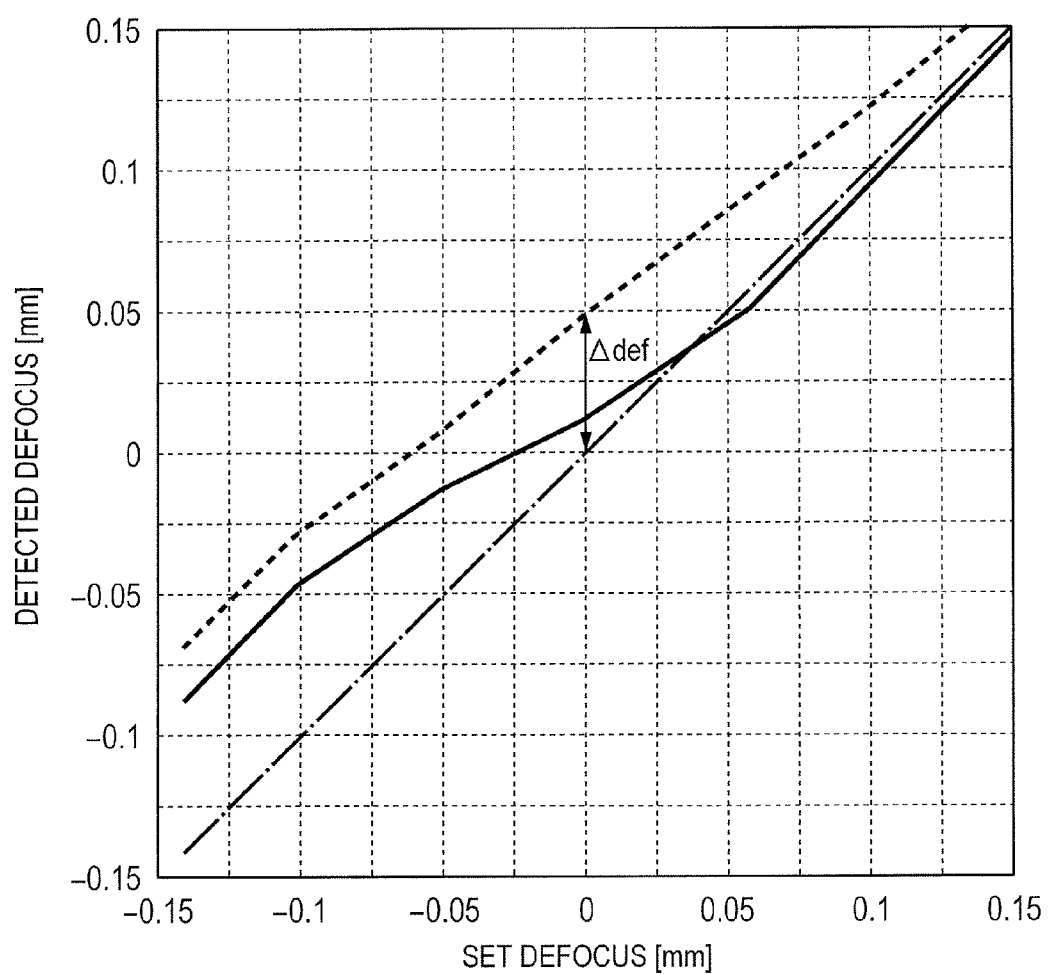
FIG. 12 is a diagram illustrating an example of calculation of a first detecting defocus amount and a second detecting defocus amount in the first embodiment of the invention.

FIG. 12 illustrates an example of the first detecting defocus amount (broken line) obtained by the first focus detection of the phase difference method in the present embodiment. An axis of abscissa denotes a set defocus amount and an axis of ordinate indicates a detected defocus amount. The first and second focus detection signals illustrated in FIG. 10 are the first and second focus detection signals in the case where a set defocus amount in FIG. 12 is equal to 0 [mm]. At the most-preferable in-focus position of the set defocus amount 0, the first detected defocus amount obtained by the first focus detection is offset by about 50 μm to the side of a state in which a focal plane of the object is on the opposite side of the imaging plane to the object and it will be understood that a difference of about 50 μm occurs between the most-preferable in-focus position and the detecting in-focus position which is calculated by the first focus detection.

In the present embodiment, therefore, in order to suppress the difference between the detected in-focus position which is calculated from the focus detection signal and the most-preferable in-focus position of the image pickup signal, in addition to the first focus detection of the phase difference method, the second focus detection of the refocus method in which the high-accuracy focus detection can be performed in the neighborhood of the most-preferable in-focus position of the focusing optical system is performed. Consequently, the high-accuracy focus detection can be performed.

Second Focus Detection of Refocus Method

Subsequently, the second focus detection of the refocus method in the embodiment will be described.

In the second focus detection of the refocus method of the present embodiment, the first and second focus detection signals are relatively shifted and added, thereby generating a shift addition signal (refocus signal). Subsequently, a contrast evaluation value of the generated shift addition signal (refocus signal) is calculated, an MTF peak position of the image pickup signal is presumed from the contrast evaluation value, and a second detecting defocus amount is detected.

Figure 13:
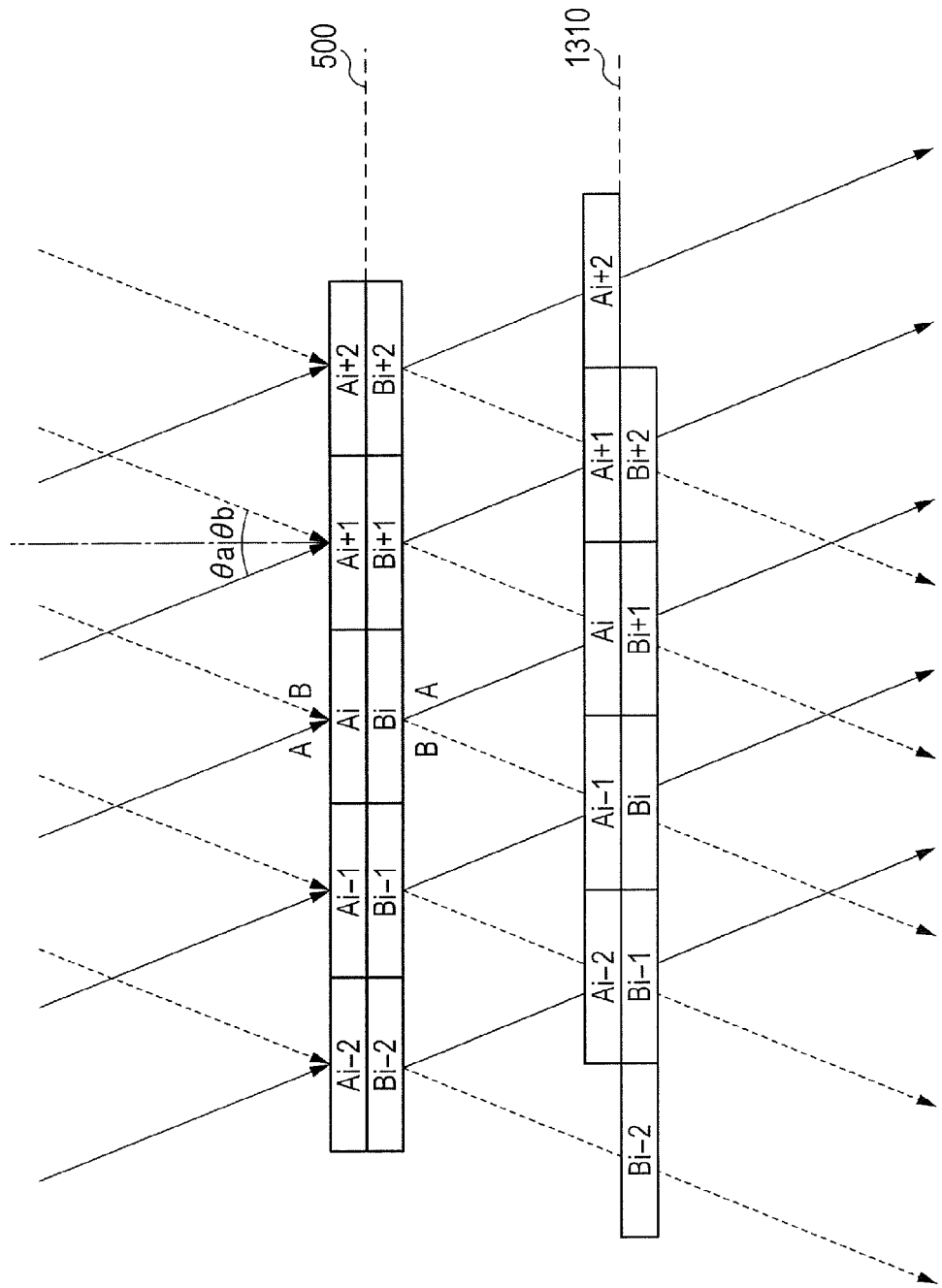
FIG. 13 is a schematic explanatory diagram of a refocus processing in the first embodiment of the invention.

FIG. 13 is a diagram for describing a refocus processing in the one-dimensional direction (row direction, horizontal direction) by the first and second focus detection signals obtained by the imaging element of the present embodiment. In the diagram, portions similar to those in FIGS. 5 and 6 are designated by the same reference numerals. In FIG. 13, now assuming that i is an integer, a first focus detection signal and a second focus detection signal of the ith pixel in the row direction of the imaging element arranged on the imaging plane 500 are schematically expressed by Ai and Bi, respectively. The first focus detection signal Ai is a light receiving signal incident on the ith pixel at a principal light ray angle θa (corresponding to the pupil partial area 401 in FIG. 5). The second focus detection signal Bi is a light receiving signal incident on the ith pixel at a principal light ray angle θb (corresponding to the pupil partial area 402 in FIG. 5).

The first focus detection signal Ai and the second focus detection signal Bi have not only light intensity distribution information but also angle-of-incidence information. Therefore, by moving the first focus detection signal Ai to a virtual imaging plane 1310 in parallel along the angle θa, moving the second focus detection signal Bi to the virtual imaging plane 1310 in parallel along the angle θb, and adding them, a refocus signal on the virtual image plane 1310 can be generated. Such an operation that the first focus detection signal Ai is moved to the virtual imaging plane 1310 in parallel along the angle θa corresponds to such an operation that the signal is shifted in the row direction by +0.5 pixel.

Such an operation that the second focus detection signal Bi is moved to the virtual imaging plane 1310 in parallel along the angle θb corresponds to such an operation that the signal is shifted in the row direction by −0.5 pixel. Therefore, by relatively shifting the first focus detection signal Ai and the second focus detection signal Bi by +1 pixel and adding Ai and Bi+1 in correspondence to each other, the refocus signal on the virtual imaging plane 1310 can be generated. Similarly, by shifting the first focus detection signal Ai and the second focus detection signal Bi by an integer number of pixels and adding, a shift addition signal (refocus signal) on each virtual imaging plane according to the shift amount of the integer number of pixels can be generated.

By calculating a contrast evaluation value of the generated shift addition signal (refocus signal) and presuming an MTP peak position of the image pickup signal from the calculated contrast evaluation value, the second focus detection of the refocus method is performed.

Figure 14:
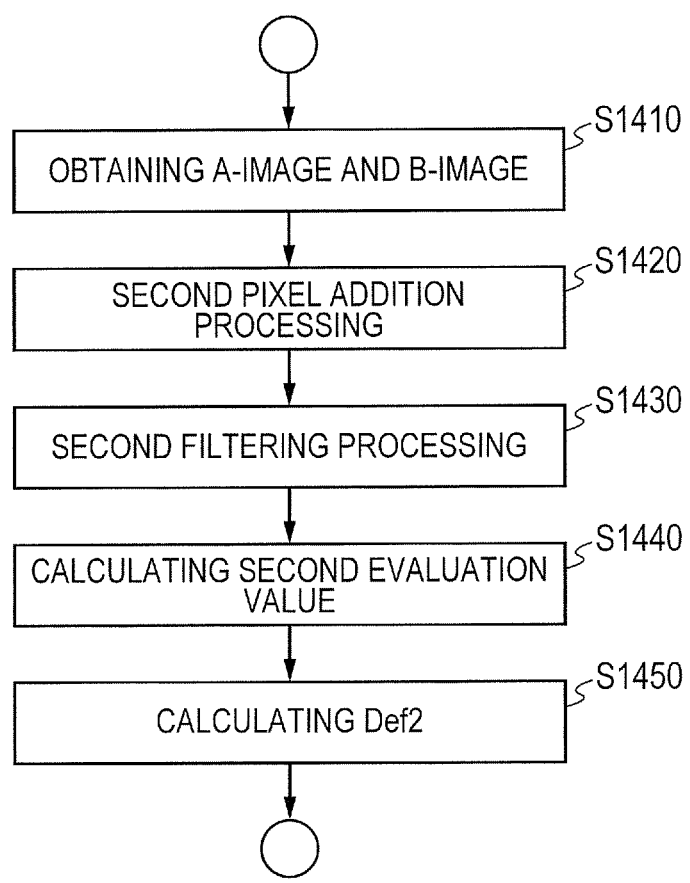
FIG. 14 is a schematic diagram of a flow for a second focus detection processing in the first embodiment of the invention.

FIG. 14 illustrates a flowchart for the second focus detecting operation in the first embodiment. The operation in FIG. 14 is also executed by the imaging element 107, the image processing unit 125, and the CPU 121 for controlling them.

In step S1410, first, the CPU 121 sets a focus detection area to perform the focus adjustment from the effective pixel areas of the imaging element. Subsequently, the CPU 121 controls the driving of the imaging element 107, obtains the first focus detection signal from the light receiving signal of the first focus detection pixel of the focus detection area, and obtains the second focus detection signal from the light receiving signal of the second focus detection pixel of the focus detection area.

In step S1420, a 3-pixel addition processing is executed in the column direction to each of the first and second focus detection signals in order to suppress a signal data amount and, further, a Bayer (RGB) addition processing is executed in order to convert the RGB signal into the luminance signal Y. Those two addition processings are referred to together as second pixel addition processing. Either the 3-pixel addition processing or the Bayer (RGB) addition processing or both of those addition processings may be omitted.

In step S1430, a second filtering processing is executed to the first and second focus detection signals. Examples of the passband of the second filtering processing in the first embodiment are illustrated by a broken line and a dotted line in FIG. 9. In the present embodiment, the focus detection is performed in a range from the small defocus state to the neighborhood of the most-preferable in-focus position by the second focus detection of the refocus method. Therefore, the passband of the second filtering processing is constructed so as to contain a higher frequency band than the passband of the first filtering processing.

Figure 9:
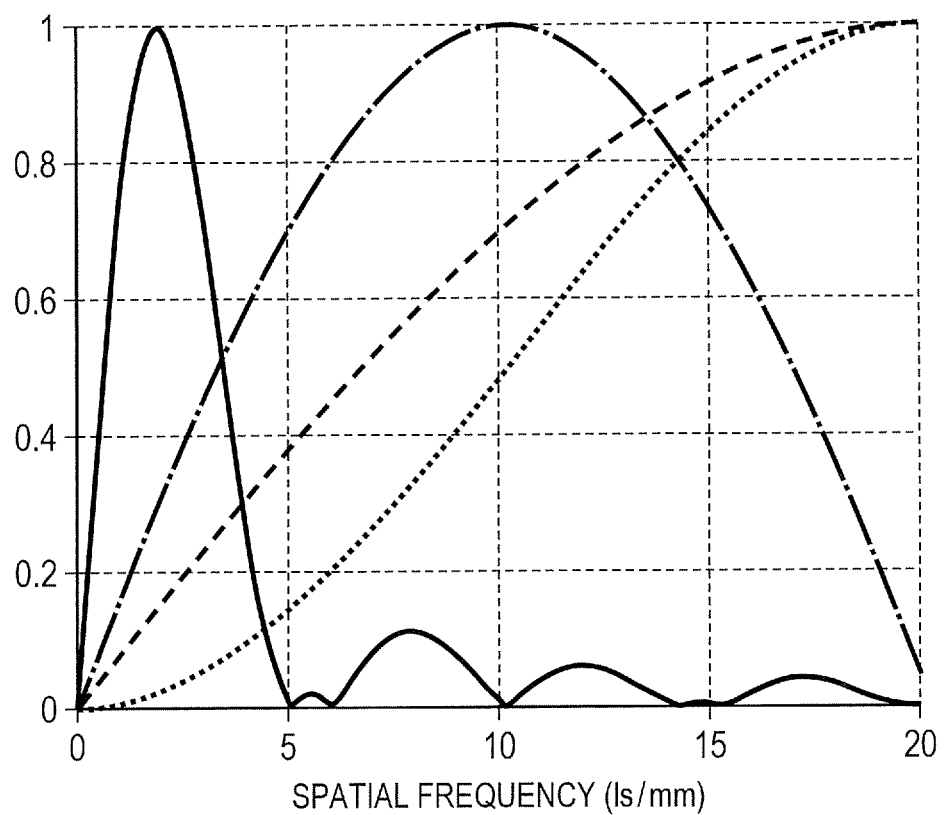
FIG. 9 is a diagram illustrating an example of a filter frequency band in the first embodiment of the invention.

In the second filtering processing, by using a Laplacian type (second order differential type) [1, −2, 1] filter for performing an edge extraction of the object signal in accordance with necessity, the passband of the second filtering processing may be constructed so as to contain a higher frequency band as illustrated by the dotted line in FIG. 9. By extracting the high frequency component of the object and performing the second focus detection, the focus detection accuracy can be further improved.

In step S1440, a second shift processing for relatively shifting, in the pupil dividing direction, the first and second focus detection signals obtained after the second filtering processing is executed and the resultant signals are added, thereby generating a shift addition signal (refocus signal).

In step S1440, a contrast evaluation value (second evaluation value) is further calculated from the generated shift addition signal.

It is assumed that the kth first focus detection signal obtained after the first filtering processing is equal to A(k), the kth second focus detection signal is equal to B(k), and the range of the number k corresponding to the focus detection area is equal to W. Now, assuming that a shift amount by the second shift processing is equal to s2 and a shift range of the shift amount s2 is equal to Γ2, a contrast evaluation value (second evaluation value) RFCON is calculated by the following equation (2).

$$RFCON(s_2) = \max_{k \in W} |A(k) + B(k - s_2)|, \quad s_2 \in \Gamma 2 \quad (2)$$

By the second shift processing of the shift amount s2, the kth first focus detection signal A(k) and a (k−s2)th second focus detection signal B(k−s2) are added in correspondence to each other, thereby generating a shift addition signal. An absolute value of the generated shift addition signal is calculated, a maximum value in the range of the focus detection area W is obtained, and a contrast evaluation value (second evaluation value) RFCON(s2) is calculated. The contrast evaluation value (second evaluation value) calculated every row may be added with respect to a plurality of rows for every shift amount in accordance with necessity.

In step S1450, a shift amount of a real number value in which the contrast evaluation value becomes a maximum value is calculated from the contrast evaluation value (second evaluation value) by a sub pixel operation and is set to a peak shift amount p2. A second detecting defocus amount (Def2) is detected by multiplying the peak shift amount p2 by a second conversion coefficient K2 according to the image height of the focus detection area, the F value of the photographing lens (focusing optical system), and the exit pupil distance. The first conversion coefficient K1 and the second conversion coefficient K2 may be set to the same value in accordance with necessity.

In the invention, by the second focus detection unit of the refocus method, the second filtering processing and the second shift processing are executed to the first and second focus detection signals and, after that, the resultant signals are added, thereby generating the shift addition signal. Subsequently, a contrast evaluation value is calculated from the shift addition signal and the second detecting defocus amount is detected from the contrast evaluation value.

In the imaging element of the present embodiment, as illustrated in FIGS. 4 and 5, the ray of light obtained by adding the ray of light which is received by the first focus detection pixel and the ray of light which is received by the second focus detection pixel is the ray of light which is received by the image pickup pixel. Different from the first focus detection of the phase difference method, in the second focus detection of the refocus method, the focus detection is performed by the shift addition signal (refocus signal) of the first and second focus detection signals. Therefore, since the ray of light corresponding to the shift addition signal which is used in the second focus detection and the ray of light corresponding to the image pickup signal almost coincide, the influence on the shift addition signal by each aberration (spherical aberration, astigmatism, coma, or the like) of the focusing optical system and that on the image pickup signal are almost equal. Therefore, since the detecting in-focus position which is calculated by the second focus detection of the refocus method (position where the second detecting defocus amount is equal to 0) and the most-preferable in-focus position (MTF peak position) almost coincide, the focus detection can be performed at a higher accuracy than that by the first focus detection of the phase difference method.

Figure 15:
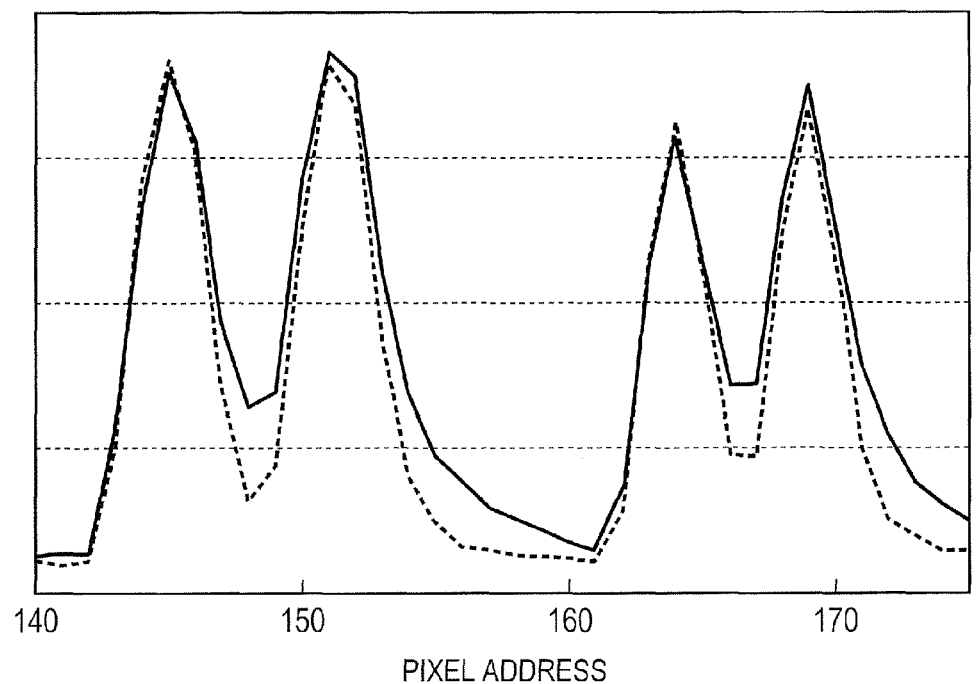
FIG. 15 is a diagram illustrating an example of the first focus detection signal and the second focus detection signal obtained after a second filtering processing in the first embodiment of the invention.
Figure 16:
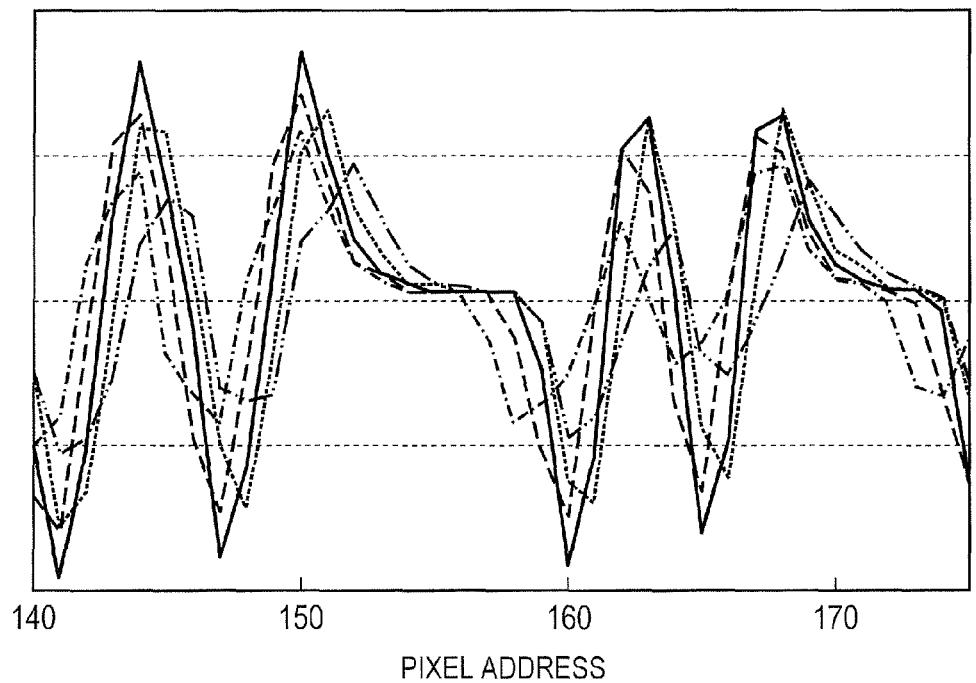
FIG. 16 is a diagram illustrating an example in which the first focus detection signal and the second focus detection signal obtained after the second filtering processing have been shift-added in the first embodiment of the invention.
Figure 17:
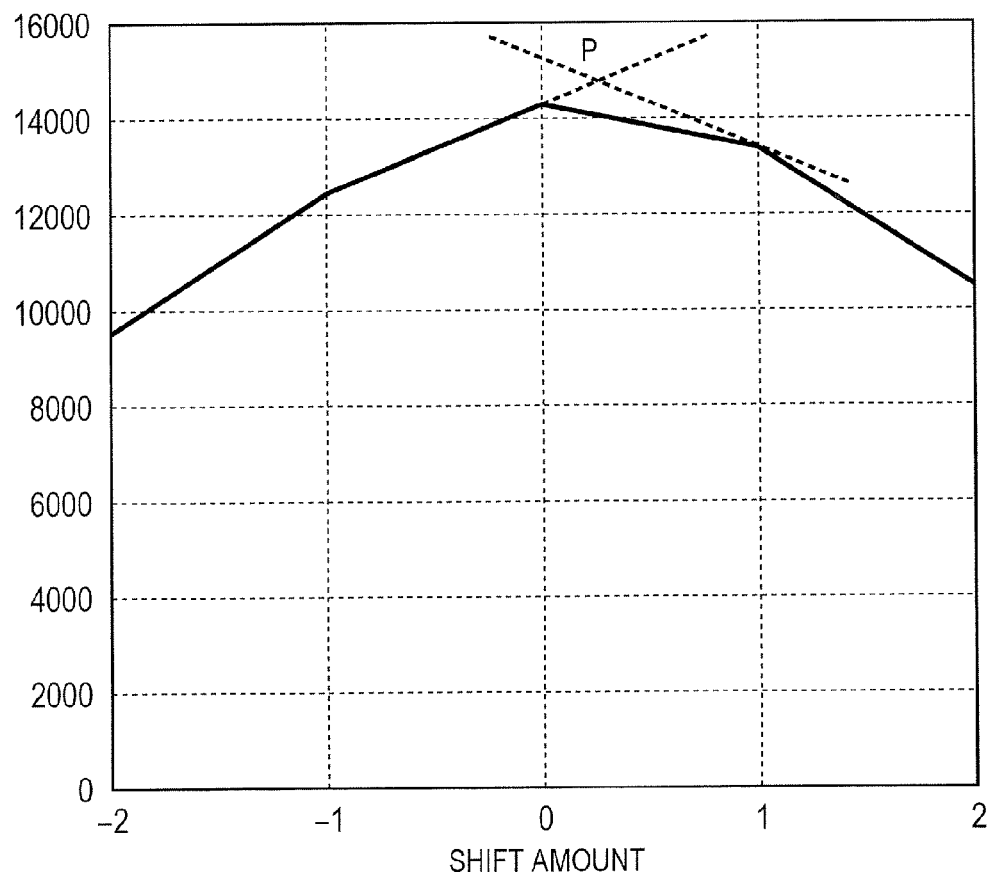
FIG. 17 is a diagram illustrating an example of a second evaluation value in the first embodiment of the invention.

FIG. 15 illustrates a first focus detection signal (broken line) and a second focus detection signal (solid line) obtained after the second filtering processing is executed to the first focus detection signal (broken line) and the second focus detection signal (solid line) at the most-preferable in-focus position of the image pickup signal in the peripheral image height of the imaging element of the present embodiment illustrated as an example in FIG. 10. FIG. 16 illustrates an example of the shift addition signal (refocus signal) in which the first focus detection signal (broken line) and the second focus detection signal (solid line) obtained after the second filtering processing are relatively shifted by −2, −1, 0, 1, and 2 pixels and added. It will be understood that a peak value of the shift addition signal changes in association with a change in shift amount. FIG. 17 illustrates an example of the contrast evaluation value (second evaluation value) calculated from each shift addition signal.

FIG. 12 illustrates an example of the second detecting defocus amount (solid line) by the second focus detection of the refocus method in the present embodiment. An axis of abscissa denotes a set defocus amount and an axis of ordinate indicates a detected defocus amount. The first and second focus detection signals illustrated in FIG. 10 are the first and second focus detection signals in the set defocus amount 0 [mm] in FIG. 12. It will be understood that at the most-preferable in-focus position of the setting defocus amount 0, the second detecting defocus amount by the second focus detection is suppressed so as to be smaller than the first detecting defocus amount by the first focus detection and the focus detection can be performed at a high accuracy. Therefore, in the present embodiment, at the neighborhood of the most-preferable in-focus position of the set defocus amount 0 of the focusing optical system, the focus detection can be performed at a higher accuracy by the second focus detection of the refocus method than the first focus detection of the phase difference method.

Refocus Possible Range

On the other hand, since there is a limitation in a refocus possible range, a range of the defocus amount in which the focus detection can be performed at a high accuracy by the second focus detection of the refocus method is limited.

Figure 18:
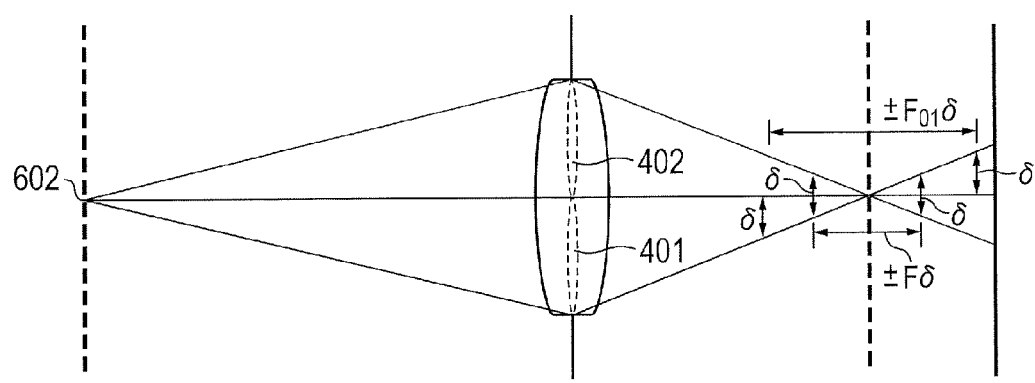
FIG. 18 is a schematic explanatory diagram of a refocus possible range in the first embodiment of the invention.

FIG. 18 is a diagram for describing the refocus possible range in the present embodiment. In the diagram, portions similar to those in FIGS. 5 and 6 are designated by the same reference numerals. As illustrated in FIG. 13, assuming that a permissible circle of confusion is set to $\delta$ and an iris value of the focusing optical system is set to F, a depth of field in the iris value F is set to $\pm F\delta$. An effective iris value $F_{01}$ in the horizontal direction of the pupil partial area 401 which is narrowed by being divided into $N_H \times N_V$ (2×1) portions is equal to $F_{01}=N_H F$, so that the image becomes dark. An effective depth of field of every first focus detection signal is equal to $\pm N_H F\delta$, so that the image becomes deep by $N_H$ times and the in-focus range is widened by $N_H$ times. In a range of the effective depth of field $\pm N_H F\delta$, the in-focused object image is obtained for every first focus detection signal (second focus detection signal). This is true of an effective iris value $F_{02}$ in the horizontal direction of the pupil partial area 402 and $F_{02}=N_H F$, so that the image becomes dark. An effective depth of field of every second focus detection signal is equal to $\pm N_H F\delta$, so that the image becomes deep by $N_H$ times. In a range of such an effective depth of field, the in-focused object image is obtained for every second focus detection signal. Therefore, by the refocus processing for moving the first focus detection signal (or second focus detection signal) in parallel along the principal light ray angle $\theta a$ (or $\theta b$) illustrated in FIG. 13, the in-focus position can be adjusted again (refocus) after the photographing. Thus, the defocus amount d from the imaging plane where the in-focus position can be adjusted again (refocus) after the photographing is limited. The refocus possible range of the defocus amount d is almost equal to a range shown by the following expression (3).

$$|d| \leq N_H F\delta \tag{3}$$

The permissible circle $\delta$ of confusion is specified by $\delta=2\Delta X$ (reciprocal number of a Nyquist frequency $1/(2\Delta X)$ of a pixel pitch $\Delta X$). A reciprocal number of a Nyquist frequency $1/(2\Delta X_{AF})$ of a pitch $\Delta X_{AF}$ (=6$\Delta X$: in the case of 6-pixel addition) of the first focus detection signal (second focus detection signal) after the second pixel addition processing may be used as a permissible circle $\delta$ of confusion ($\delta=2\Delta X_{AF}$) in accordance with necessity.

A range of the defocus amount in which the focus detection can be performed at a high accuracy by the second focus detection of the refocus method is almost limited to the range shown by the expression (3). A defocus range in which the focus detection can be performed at a high accuracy by the second focus detection is a range which is equal to or smaller than the defocus range in which the focus detection can be performed by the first focus detection of the phase difference method. As illustrated in FIG. 6, relative shift amount and defocus amount in the horizontal direction of the first and second focus detection signals are almost proportional. Therefore, in the invention, the shift range of the second shift processing of the second focus detection of the refocus method is constructed so as to be equal to or smaller than the shift range of the first shift processing of the first focus detection of the phase difference method.

In the focus detection of the present embodiment, the first focus detection is performed in order to perform the focus adjustment in a range from the large defocus state of the focusing optical system to the small defocus state, and the second focus detection is performed in order to perform the focus adjustment in a range from the small defocus state of the focusing optical system to the neighborhood of the most-preferable in-focus position. Therefore, it is desirable that the passband of the second filtering processing of the second focus detection contains the higher frequency band than the passband of the first filtering processing of the first focus detection. It is desirable that the pixel addition number of the second pixel addition processing of the second focus detection is equal to or smaller than the pixel addition number of the first pixel addition processing of the first focus detection.

As mentioned above, when the iris value of the focusing optical system is equal to or smaller than a predetermined iris value, there is a case where the focus detection accuracy of the first focus detection of the phase difference method deteriorates. Therefore, when the iris value of the focusing optical system is equal to or smaller than the predetermined iris value, it is desirable to detect the second detecting defocus amount by the second focus detection of the refocus method in addition to the first focus detection of the phase difference method and perform the high-accuracy focus detection in accordance with necessity.

In the present embodiment, since the pupil area is pupil-divided into two portions in the horizontal direction, the MTF peak position in the horizontal direction can be detected from the contrast evaluation value of the image pickup signal. In accordance with necessity, a difference between the MTF peak position in the horizontal direction of the image pickup signal and the MTF peak position of the image pickup signal (average of the MTF peak positions in the horizontal and vertical directions of the image pickup signal) may be held as a correction value and the second detecting defocus amount may be corrected.

Figure 19:
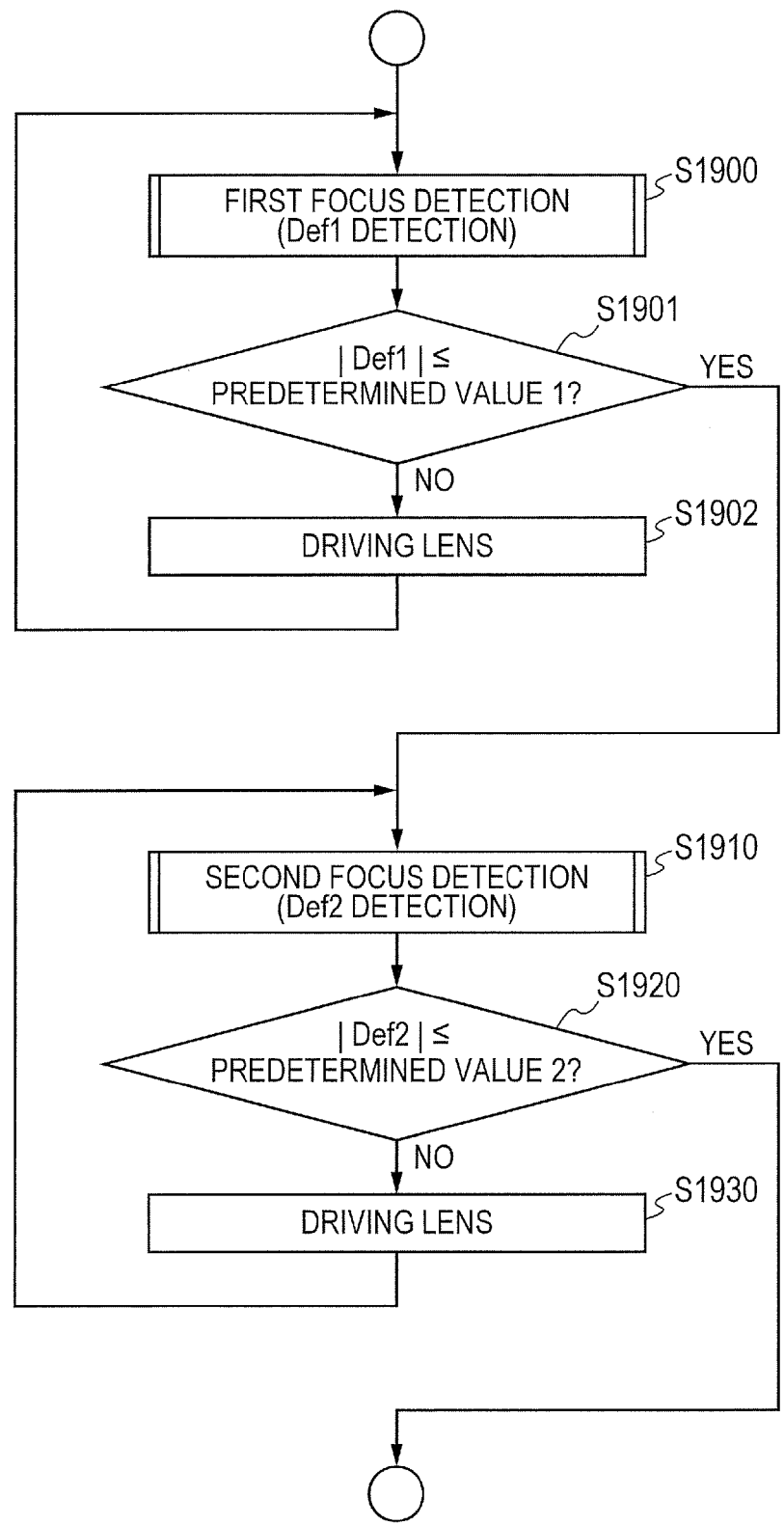
FIG. 19 is a schematic diagram of a flow for the focus detection processing in the first embodiment of the invention.

FIG. 19 illustrates a flowchart for the focus detecting operation in the present embodiment. The operation in FIG. 19 is also executed by the imaging element 107, the image processing unit 125, and the CPU 121 for controlling them.

In the first embodiment, until the absolute value of the defocus amount of the focusing optical system is equal to or smaller than the first predetermined value, the first focus detection of the phase difference method is performed, the lens driving is performed, and the focus adjustment is performed in a range from the large defocus state of the focusing optical system to the small defocus state. After that, until the absolute value of the defocus amount of the focusing optical system is equal to or smaller than the second predetermined value (<the first predetermined value), the second focus detection of the refocus method is performed, the lens driving is performed, and the focus adjustment is performed in a range from the small defocus state of the focusing optical system to the neighborhood of the most-preferable in-focus position.

In step S1900, the image processing unit 125 detects the first detecting defocus amount (Def1) by the first focus detection of the phase difference method. The detecting operation is executed when the image processing unit 125 operates in accordance with the flowchart illustrated in FIG. 7. In step S1901, the CPU 121 determines whether or not a magnitude of the first defocus amount (Def1) is larger than the first predetermined value. If the magnitude |Def1| of the detected first defocus amount (Def1) is larger than the first predetermined value, in step S1902, the lens driving is performed in accordance with the first defocus amount (Def1) and the processing routine is returned to step S1900. When the magnitude |Def1| of the detected first defocus amount (Def1) is equal to or smaller than the first predetermined value, step S1910 follows.

In step S1910, the second detecting defocus amount (Def2) is detected by the second focus detection of the refocus method. The detecting operation is executed when the image processing unit 125 operates in accordance with the flowchart illustrated in FIG. 14. In step S1920, the CPU 121 determines whether or not a magnitude of the second defocus amount (Def2) is larger than the second predetermined value. If the magnitude |Def2| of the detected second defocus amount (Def2) is larger than the second predetermined value (<the first predetermined value), in step S1930, the lens driving is performed in accordance with the second defocus amount (Def2) and the processing routine is returned to step S1910. When the magnitude |Def2↑ of the detected second defocus amount (Def2) is equal to or smaller than the second predetermined value, the focus adjustment operation is finished.

By the above construction, the difference between the detecting an in-focus position which is calculated from the focus detection signal and the most-preferable in-focus position of the image pickup signal is suppressed and the high-accuracy focus detection can be performed. Although the image pickup pixel is divided in the horizontal direction in the present embodiment, even if the image pickup pixel is divided in the vertical direction, the operation can be similarly executed.

Second Embodiment

Figure 20:
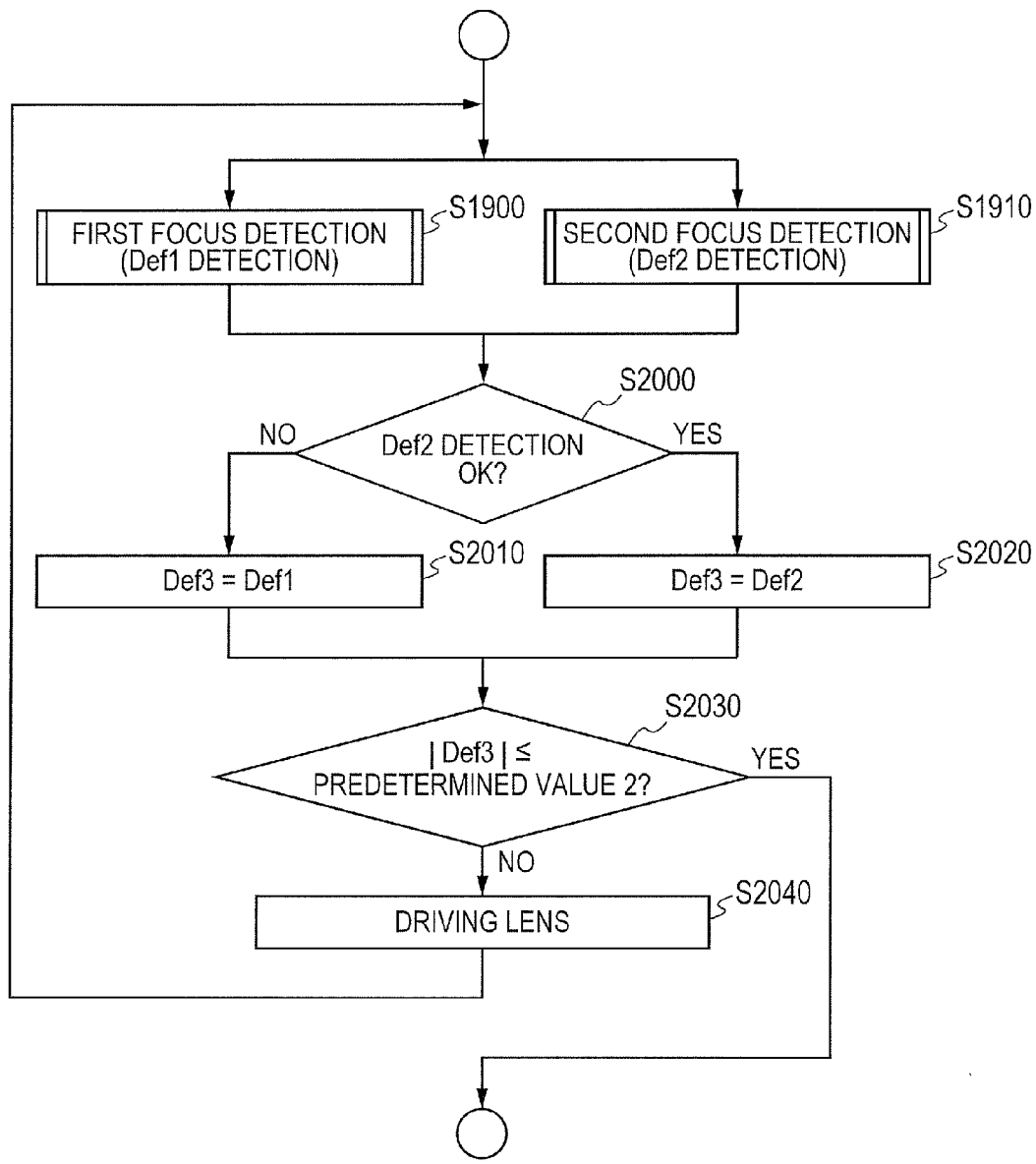
FIG. 20 is a schematic diagram of a flow for the focus detection processing in the second embodiment of the invention.

FIG. 20 illustrates a flowchart for the focus detecting operation in the second embodiment. In the diagram, portions similar to those in FIG. 19 are denoted with the same reference numerals. Since a construction of the imaging apparatus in the present embodiment is similar to that in the first embodiment, its description is omitted here. The focus detecting operation is executed by a method whereby the CPU 121 controls the focusing optical system, imaging element 107, and image processing unit 125.

The present embodiment relates to an example in which the detection of the first detecting defocus amount by the first focus detection of the phase difference method and the detection of the second detecting defocus amount by the second focus detection of the refocus method are processed in parallel, thereby realizing a high speed of the focus detecting operation.

In step S1900 in FIG. 20, the first detecting defocus amount (Def1) is detected by the first focus detection by the phase difference method. In parallel with it, the second detecting defocus amount (Def2) is detected by the second focus detection by the refocus method.

In step S2000, the CPU 121 determines whether or not the second detecting defocus amount (Def2) is detected in the shift range of the second shift processing. If the second detecting defocus amount (Def2) is detected, the CPU 121 sets the second detecting defocus amount (Deft) to a third detecting defocus amount (Def3) (S2020). If it is not detected, the CPU 121 sets the first detecting defocus amount (Deft) to the third detecting defocus amount (Def3) (S2010). Subsequently, in step S2030, the CPU 121 determines whether or not a magnitude |Def3| of the third defocus amount (Def3) is larger than the second predetermined value. If the magnitude |Def3| is larger than the second predetermined value, in step S2040, the CPU 121 controls the focusing optical system, performs the lens driving in accordance with the third defocus amount (Def3), and returns to steps S1900 and S1910. If the magnitude |Def3| of the third defocus amount (Def3) is equal to or smaller than the second predetermined value, the focus adjustment operation is finished.

A construction other than that mentioned above is similar to that in the first embodiment.

By the above construction, the difference between the detecting in-focus position which is calculated from the focus detection signal and the most-preferable in-focus position of the image pickup signal is suppressed and the high-accuracy and high-speed focus detection can be performed.

Third Embodiment

Figure 21:
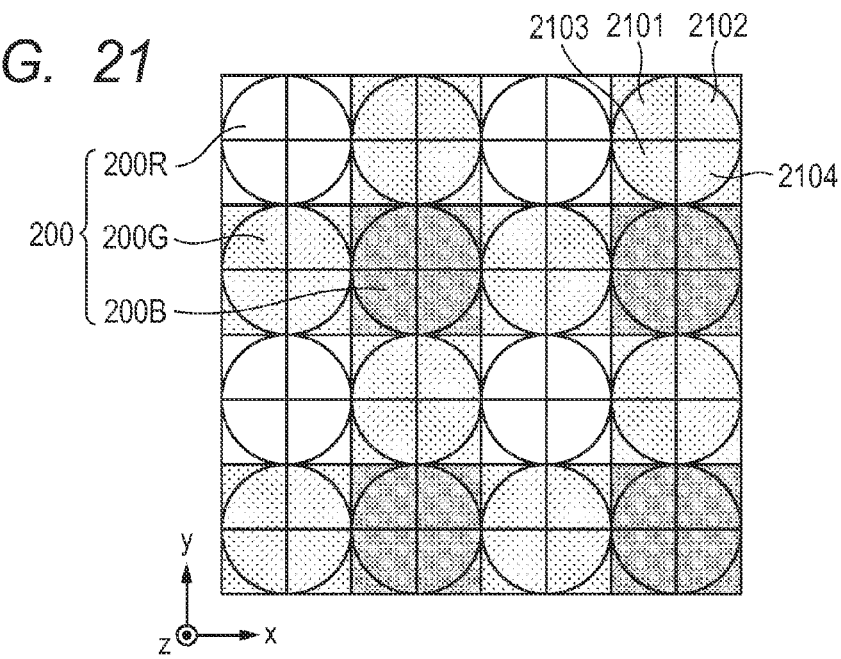
FIG. 21 is a schematic diagram of a pixel array in the third embodiment of the invention.

FIG. 21 illustrates a schematic diagram of an array of image pickup pixels and sub pixels of the imaging element in the third embodiment of the invention. In FIG. 21, the array of the pixels (image pickup pixels) of a two-dimensional CMOS sensor (imaging element) of the third embodiment is illustrated by a range of (4 columns×4 rows) and the array of the pixels is illustrated by a range of (8 columns×8 rows). In FIG. 21, portions similar to those in FIG. 2 are denoted with the same reference numerals. Since a construction of the imaging apparatus in the present embodiment is similar to that in the first embodiment except for a pixel construction of the imaging element, the pixel construction of the imaging element will be described here.

In the present embodiment, in the pixel group 200 of (2 columns×2 rows) illustrated in FIG. 21, the pixel 200R having the spectrum sensitivity of R (red) is arranged at an upper left position in the diagram, the pixels 200G having the spectrum sensitivity of G (green) are arranged at an upper right position and a lower left position, and the pixel 200B having the spectrum sensitivity of B (blue) is arranged at a lower right position, respectively. Further, each pixel is constructed by sub pixels 2101 to 2104 arranged in an array of (2 columns×2 rows).

A number of pixels of (4 columns×4 rows) (sub pixels of 8 columns×8 rows) illustrated in FIG. 21 are arranged on the imaging plane, thereby enabling the image pickup signal (sub pixel signal) to be obtained. The present embodiment will be described on the assumption that the imaging element 107 is an element constructed in such a manner that the pitch P of the pixels is equal to 4 μm, the number N of pixels is equal to about 20.75 million pixels (5575 columns in the lateral direction×3725 rows in the vertical direction), a pitch $P_{SUB}$ of the sub pixels is equal to 2 μm, and the number $N_{SUB}$ of sub pixels is equal to about 83.00 million pixels (11150 columns in the lateral direction×7450 rows in the vertical direction), respectively.

Figure 22A:
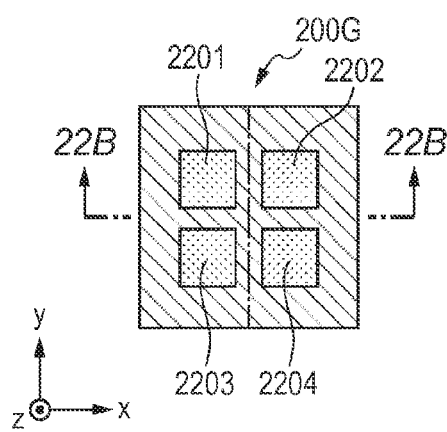
FIGS. 22A and 22B are a schematic plan view and a schematic cross sectional view in the third embodiment of the invention.
Figure 22B:
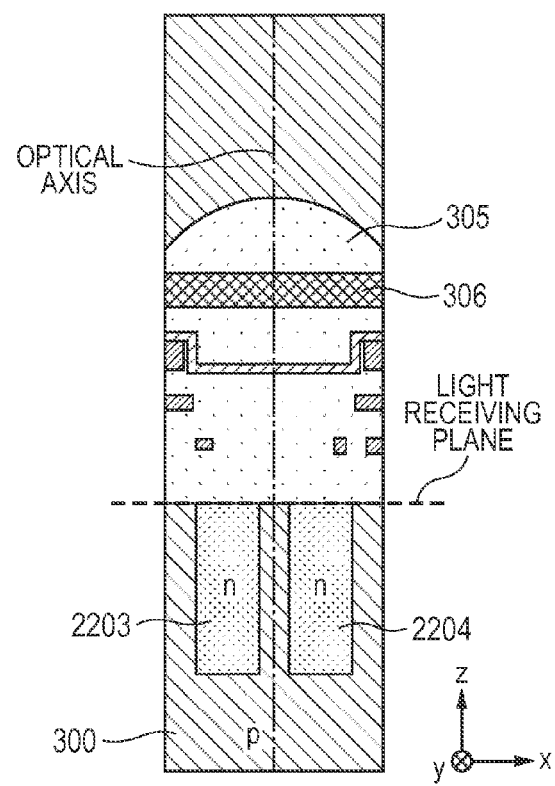

FIG. 22A illustrates a plan view when viewing one pixel 200G of the imaging element illustrated in FIG. 21 from the light receiving plane side (+z side) of the imaging element. FIG. 22B illustrates a cross sectional view when viewing a cross section taken along the line a-a in FIG. 22A from the −y side. In FIGS. 22A and 22B, portions similar to those in FIGS. 3A and 3B are denoted with the same reference numerals.

As illustrated in FIGS. 22A and 22B, in the pixel 200G of the present embodiment, the microlens 305 to converge incident light onto the light receiving plane of each pixel is formed. Photoelectric conversion units 2201 to 2204 which are divided into $N_H$ portions (two portions) in the x direction and $N_V$ portions (two portions) in the y direction are formed. The photoelectric conversion units 2201 to 2204 correspond to the sub pixels 2101 to 2104, respectively.

In the present embodiment, by adding signals of the sub pixels 2101 to 2104 for every pixel of the imaging element, the image pickup signal (picked-up image) of resolution of the number N of effective pixels is generated. By adding the signals of the sub pixels 2101 and 2103 every pixel, the first focus detection signal can be generated. By adding the signals of the sub pixels 2102 and 2104 every pixel, the second focus detection signal can be generated. By those addition processings, the first focus detection signal and the second focus detection signal corresponding to the pupil division in the horizontal direction can be obtained, and the first focus detection of the phase difference method and the second focus detection of the refocus method can be performed.

Similarly, in the present embodiment, by adding the signals of the sub pixels 2101 and 2102 for every pixel, the first focus detection signal can be generated, and by adding the signals of the sub pixels 2103 and 2104 for every pixel, the second focus detection signal can be generated. By those addition processings, the first focus detection signal and the second focus detection signal corresponding to the pupil division in the vertical direction can be obtained, and the first focus detection of the phase difference method and the second focus detection of the refocus method can be performed. Consequently, the imaging element of the present embodiment can be used as an imaging element of the imaging apparatus in the first or second embodiment.

A construction other than that mentioned above is similar to that in the first embodiment.

By the above construction, the difference between the detecting in-focus position which is calculated from the focus detection signal and the most-preferable in-focus position of the image pickup signal is suppressed and the high accuracy or the high-sensitivity and high-speed focus detection can be performed.

Embodiments of the present invention can also be realized by a computer of a system or apparatus that reads out and executes computer-executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer-executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer-executable instructions may be provided to the computer, for example, from a network or the storage medium. The storage medium may include, for example, one or more of a hard disk, a random access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-106195, filed on May 20, 2013, which is hereby incorporated by reference herein in its entirety.

What is claimed is:

1. A focus detection apparatus comprising:
at least one processor, configured to function as:
an obtaining unit configured to obtain first and second image signals having a mutual parallax;
a combination unit configured to generate a combination signal obtained by combining the first and second image signals at least one of which is shifted by a predetermined step, wherein the shift and the generation of the combination signal which are performed by the combination unit are executed for a plurality of predetermined steps and a plurality of combination signals are generated;
a calculation unit configured to calculate a contrast evaluation value from the plurality of combination signals; and
a focus detection unit configured to detect a defocus amount on the basis of the contrast evaluation value and a shift amount of the shift.

2. An apparatus according to claim 1, wherein the focus detection unit detects the defocus amount from the shift amount of the shift by which the contrast evaluation value peaks.

3. An apparatus according to claim 1, wherein each of the first and second image signals is constructed by a plurality of pixel signals.

4. An apparatus according to claim 1, wherein a high-pass filtering processing is performed to each of the first and second image signals.

5. An apparatus according to claim 1, wherein the at least one processor is further configured to function as a phase difference detection unit configured to detect a defocus amount on the basis of a phase difference between the first and second image signals.

6. An apparatus according to claim 5, further comprising a focus actuator configured to position the focusing optical system so as to perform a focus adjustment in such a manner that in a case where a magnitude of the defocus amount detected by the phase difference detection unit is larger than a first predetermined amount, the phase difference detection unit is controlled such that the focus adjustment is performed on the basis of the defocus amount detected by the phase difference detection unit, and when the magnitude of the defocus amount detected by the phase difference detection unit is smaller than the first predetermined amount, the focus detection unit is controlled such that the focus adjustment is performed on the basis of the defocus amount detected by the focus detection unit.

7. An apparatus according to claim 1, wherein the first image signal corresponds to object light which passes through a first pupil area of a focusing optical system, and the second image signal corresponds to object light which passes through a second pupil area different from the first pupil area of the focusing optical system.

8. A focus adjustment apparatus for performing a focus adjustment of an object by using pixel signals obtained by photoelectrically converting object light which passes through different pupil areas of a focusing optical system for forming an optical image of the object, comprising:
at least one processor, configured to function as:
an obtaining unit configured to obtain the pixel signals;
a signal generation unit configured to generate a plurality of focus detection signals corresponding to the different pupil areas by using the pixel signals;
a first focus detection unit configured to detect a first defocus amount on the basis of a correlation amount which is generated from the plurality of focus detection signals;
a second focus detection unit configured to detect a second defocus amount on the basis of a contrast evaluation value which is generated from the plurality of focus detection signals; and
a control unit configured to control the first focus detection unit and the second focus detection unit and control the focus adjustment in accordance with a focus adjustment state of the object on the basis of one of the first defocus amount and the second defocus amount.

9. An apparatus according to claim 8, wherein the at least one processor functioning as the first focus detection unit is further configured to function as a first filtering processing unit configured to execute a first filtering processing to the plurality of focus detection signals and an image shift amount detection unit configured to calculate the correlation amount by executing a first shift processing of the plurality of focus detection signals subjected to the first filtering processing and detect an image shift amount on the basis of the correlation amount,
wherein the at least one processor functioning as the second focus detection unit is further configured to function as a second filtering processing unit configured to execute a second filtering processing to the plurality of focus detection signals and an evaluation value calculation unit configured to generate a refocus signal by executing a second shift processing to the plurality of focus detection signals subjected to the second filtering processing and adding resultant signals and calculate a contrast evaluation value of the refocus signal, and detects the second defocus amount from the contrast evaluation value, and
wherein a shift range of the second shift processing is equal to or smaller than a shift range of the first shift processing.

10. An apparatus according to claim 9, wherein a passband of the second filtering processing includes a higher frequency band than a passband of the first filtering processing.

11. An apparatus according to claim 8, wherein in a case where an iris value of the focusing optical system is equal to or smaller than a predetermined iris value, the control unit detects the second defocus amount by the second focus detection unit.

12. An apparatus according to claim 8, wherein the first focus detection unit executes a first pixel addition processing to each of the plurality of focus detection signals,
wherein the second focus detection unit executes a second pixel addition processing to each of the plurality of focus detection signals, and
wherein a pixel addition number of the second pixel addition processing is equal to or smaller than a pixel addition number of the first pixel addition processing.

13. An apparatus according to claim 8, wherein the at least one processor functioning as the first focus detection unit is further configured to function as an optical correction processing unit configured to execute an optical correction processing to the plurality of focus detection signals.

14. An apparatus according to claim 9, wherein the second focus detection unit corrects the second defocus amount on the basis of the contrast evaluation value.

15. An apparatus according to claim 8, wherein: until a magnitude of the first defocus amount becomes equal to or smaller than a first predetermined value, the control unit controls the first focus detection unit and performs the focus adjustment on the basis of the first defocus amount, and
in a case where the magnitude of the first defocus amount is equal to or smaller than the first predetermined value, the control unit controls the second focus detection unit and performs the focus adjustment on the basis of the second defocus amount until a magnitude of the second defocus amount becomes equal to or smaller than a second predetermined value.

16. An apparatus according to claim 8, wherein the control unit controls the first focus detection unit and the second focus detection unit and detects the first defocus amount and the second defocus amount, and
on the basis of the second defocus amount in a case where the second defocus amount is detected, and on the basis of the first defocus amount in case where the second defocus amount is not detected, the control unit performs the focus adjustment of the object until a magnitude of the second or first defocus amount becomes equal to or smaller than a predetermined value.

17. An imaging apparatus comprising:
a focusing optical system that includes one or more optical elements and is configured to form an optical image of an object;
an image sensor configured to receive, through a pupil division unit, object light which passes through different pupil areas of the focusing optical system and photoelectrically convert the received object light, thereby generating pixel signals corresponding to the object light which passes through the different pupil areas; and at least one processor, configured to function as:
a signal generation unit configured to generate a plurality of focus detection signals corresponding to the different pupil areas by using the pixel signals;
a first focus detection unit configured to detect a first defocus amount on the basis of an image shift amount of the plurality of focus detection signals;
a second focus detection unit configured to detect a second defocus amount on the basis of a shift amount of the focus detection signal for generating a refocus signal from the plurality of focus detection signals; and
a control unit configured to control the first focus detection unit and the second focus detection unit and controls the driving of the focusing optical system in accordance with a focus adjustment state of the object on the basis of one of the first defocus amount and the second defocus amount.

18. An apparatus according to claim 17, wherein until a magnitude of the first defocus amount becomes equal to or smaller than a first predetermined value, the control unit controls the first focus detection unit, drives the focusing optical system on the basis of the first defocus amount, and performs a focus adjustment, and
in a case where the magnitude of the first defocus amount is equal to or smaller than the first predetermined value, until a magnitude of the second defocus amount becomes equal to or smaller than a second predetermined value, the control unit controls the second focus detection unit, drives the focusing optical system on the basis of the second defocus amount, and performs the focus adjustment.

19. An apparatus according to claim 17, wherein the control unit controls the first focus detection unit and the second focus detection unit and detects the first defocus amount and the second defocus amount, and
on the basis of the second defocus amount in a case where the second defocus amount is detected, and on the basis of the first defocus amount in a case where the second defocus amount is not detected, the control unit drives the focusing optical system and performs the focus adjustment until a magnitude of the second or first defocus amount becomes equal to or smaller than a predetermined value.

20. An apparatus according to claim 17, wherein the imaging sensor includes a first focus detection pixel for receiving a ray of light passing through a first pupil partial area of the focusing optical system and a second focus detection pixel for receiving a ray of light passing through a second pupil partial area of the focusing optical system different from the first pupil partial area, and
wherein the first focus detection pixel and the second focus detection pixel construct an image pickup pixel for receiving the ray of light passing through a pupil area in which the first pupil partial area and the second pupil partial area of the focusing optical system are combined.

21. An apparatus according to claim 17, wherein the focusing optical system includes a focus lens, and wherein the control unit controls a driving of the focus lens.

22. A focus detection method comprising:
an obtaining step of obtaining first and second image signals having a mutual parallax;
a combining step of generating a combination signal obtained by combining the first and second image signals at least one of which is shifted by a predetermined step, wherein the shift and the generation of the combination signal in the combining step are executed for a plurality of predetermined steps and a plurality of combination signals are generated;
a calculation step of calculating a contrast evaluation value from the plurality of combination signals; and
a focus detection step of detecting a defocus amount on the basis of the contrast evaluation value and a shift amount of the shift.

23. A focus detection method according to claim 22, wherein the first image signal corresponds to object light which passes through a first pupil area of a focusing optical system, and the second image signal corresponds to object light which passes through a second pupil area different from the first pupil area of the focusing optical system.

24. A non-transitory computer-readable storage medium storing a program for controlling a focus detection apparatus, wherein the program comprises code for causing a computer to function as:
an obtaining unit configured to obtain first and second image signals having a mutual parallax;
a combination unit configured to generate a combination signal obtained by combining the first and second image signals at least one of which is shifted by a predetermined step, wherein the shift and the generation of the combination signal which are performed by the combination unit are executed for a plurality of predetermined steps and a plurality of combination signals are generated;
a calculation unit configured to calculate a contrast evaluation value from the plurality of combination signals; and
a focus detection unit configured to detect a defocus amount on the basis of the contrast evaluation value and a shift amount of the shift.

25. A non-transitory computer-readable storage medium according to claim 24, wherein the first image signal corresponds to object light which passes through a first pupil area of a focusing optical system, and the second image signal corresponds to object light which passes through a second pupil area different from the first pupil area of the focusing optical system.

26. A focus adjustment method of performing a focus adjustment of an object by using pixel signals obtained by photoelectrically converting object light which passes through different pupil areas of a focusing optical system for forming an optical image of the object, comprising:
an obtaining step of obtaining the pixel signals;
a signal generation step of generating a plurality of focus detection signals corresponding to the different pupil areas by using the pixel signals;
a first focus detection step of detecting a first defocus amount on the basis of an image shift amount of the plurality of focus detection signals;
a second focus detection step of detecting a second defocus amount on the basis of a shift amount of a focus detection signal to generate a refocus signal from the plurality of focus detection signals; and
a control step of controlling the first focus detection step and the second focus detection step and controlling the focus adjustment in accordance with a focus adjustment state of the object on the basis of one of the first defocus amount and the second defocus amount.

27. A non-transitory computer-readable storage medium storing a program for controlling a focus adjustment apparatus for performing a focus adjustment of an object by using pixel signals obtained by photoelectrically converting object light which passes through different pupil areas of a focusing optical system for forming an optical image of the object, wherein the program comprises code for causing a computer to function as:
  an obtaining unit configured to obtain the pixel signals;
  a signal generation unit configured to generate a plurality of focus detection signals corresponding to the different pupil areas by using the pixel signals;
  a first focus detection unit configured to detect a first defocus amount on the basis of an image shift amount of the plurality of focus detection signals;
  a second focus detection unit configured to detect a second defocus amount on the basis of a shift amount of a focus detection signal to generate a refocus signal from the plurality of focus detection signals; and
  a control unit configured to control the first focus detection unit and the second focus detection unit and control the focus adjustment in accordance with a focus adjustment state of the object on the basis of one of the first defocus amount and the second defocus amount.

* * * * *